United States Patent
Topaloglu et al.

(10) Patent No.: US 11,050,009 B2
(45) Date of Patent: Jun. 29, 2021

(54) METHODS FOR ANNEALING QUBITS WITH AN ANTENNA CHIP

(71) Applicant: International Business Machines Corporation, Armonk, NY (US)

(72) Inventors: Rasit Onur Topaloglu, Poughkeepsie, NY (US); Sami Rosenblatt, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 360 days.

(21) Appl. No.: 16/115,001

(22) Filed: Aug. 28, 2018

(65) Prior Publication Data
US 2020/0075833 A1    Mar. 5, 2020

(51) Int. Cl.
*H01L 39/22* (2006.01)
*G06N 10/00* (2019.01)
(Continued)

(52) U.S. Cl.
CPC ............ *H01L 39/223* (2013.01); *B82Y 20/00* (2013.01); *G06N 10/00* (2019.01); *H01L 39/025* (2013.01); *H01L 39/2493* (2013.01); *H01Q 1/364* (2013.01)

(58) Field of Classification Search
CPC ................. H01L 39/223; H01L 39/025; H01L 39/2493; B82Y 20/00; H01Q 1/364
See application file for complete search history.

(56) References Cited

U.S. PATENT DOCUMENTS

| 5,532,592 | A  | 7/1996  | Colclough     |
| 6,960,780 | B2 | 11/2005 | Blais et al.  |

(Continued)

FOREIGN PATENT DOCUMENTS

| WO | 2016/126979 A1 | 8/2016  |
| WO | 2016/168642 A1 | 10/2016 |

(Continued)

OTHER PUBLICATIONS

International Search Report and Written Opinion received for PCT Application Serial No. PCT/EP2019/072501 dated Nov. 20, 2019, 15 pages.

(Continued)

*Primary Examiner* — Matthew L Reames
(74) *Attorney, Agent, or Firm* — Amin, Turocy & Watson, LLP

(57) ABSTRACT

Systems, computer-implemented methods, and techniques facilitating antenna-based thermal annealing of qubits are provided. In one example, a first antenna can be positioned above a superconducting qubit chip having a first Josephson junction and a second Josephson junction. The first antenna can direct a first electromagnetic wave toward the first Josephson junction. A first length of a first defined vertical gap, between the first antenna and the superconducting qubit chip, can be sized to cause the first electromagnetic wave to circumscribe a first set of one or more capacitor pads of the first Josephson junction, thereby annealing the first Josephson junction, without annealing the second Josephson junction. In another example, the first length of the first defined vertical gap can be a function of a model of the first electromagnetic wave as a cone, wherein the cone originates from the first antenna and extends toward the superconducting qubit chip.

13 Claims, 17 Drawing Sheets

(51) Int. Cl.
*B82Y 20/00* (2011.01)
*H01L 39/02* (2006.01)
*H01L 39/24* (2006.01)
*H01Q 1/36* (2006.01)

(56) References Cited

U.S. PATENT DOCUMENTS

| | | | |
|---|---|---|---|
| 7,893,708 | B2 | 2/2011 | Baumgardner et al. |
| 8,193,808 | B2 | 5/2012 | Fu et al. |
| 8,633,472 | B2 | 1/2014 | Boulaevskii et al. |
| 8,922,239 | B2 | 12/2014 | Pesetski et al. |
| 9,564,573 | B1 | 2/2017 | Chang et al. |
| 9,607,270 | B2 | 3/2017 | Harris et al. |
| 9,614,532 | B1 | 4/2017 | Bulzacchelli et al. |
| 9,685,935 | B2 | 6/2017 | Strand et al. |
| 9,934,468 | B2 | 4/2018 | Mohseni et al. |
| 9,948,254 | B2 | 4/2018 | Narla et al. |
| 10,050,630 | B2 | 8/2018 | Reagor et al. |
| 10,074,793 | B2 | 9/2018 | Abdo |
| 10,134,972 | B2 | 11/2018 | Oliver et al. |
| 10,170,680 | B2 | 1/2019 | Abraham et al. |
| 10,170,681 | B1 | 1/2019 | Rosenblatt et al. |
| 10,187,065 | B2 | 1/2019 | Kerman |
| 10,256,392 | B1 | 4/2019 | Brink et al. |
| 10,268,968 | B2 | 4/2019 | Abraham et al. |
| 10,320,331 | B1 | 6/2019 | Abdo |
| 10,418,540 | B2 | 9/2019 | Orcutt et al. |
| 10,510,943 | B1 | 12/2019 | Topaloglu et al. |
| 2012/0075158 | A1 | 3/2012 | Kawahata |
| 2015/0241481 | A1 | 8/2015 | Narla et al. |
| 2016/0336646 | A1 | 11/2016 | Baek et al. |
| 2017/0092834 | A1 | 3/2017 | Fong et al. |
| 2017/0155361 | A1 | 6/2017 | Suzuki et al. |
| 2017/0300827 | A1 | 10/2017 | Amin et al. |
| 2018/0013052 | A1 | 1/2018 | Oliver et al. |
| 2018/0054201 | A1 | 2/2018 | Reagor et al. |
| 2018/0013426 | A1 | 6/2018 | Deurloo et al. |
| 2020/0075833 | A1 | 3/2020 | Topaloglu et al. |

FOREIGN PATENT DOCUMENTS

| | | |
|---|---|---|
| WO | 2017047380 A1 | 3/2017 |
| WO | 2017078735 A1 | 5/2017 |
| WO | 2017105429 A1 | 6/2017 |
| WO | 2017139683 A1 | 8/2017 |
| WO | 2018063206 A1 | 4/2018 |

OTHER PUBLICATIONS

Granata et al., "Localized laser trimming of critical current in niobium based Josephson devices", Applied Physics Letters, AIP Publishing LLC, US, vol. 90, No. 23, Jun. 6, 2007, 3 pages.

Huber et al., "Thermal annealing of Nb/Al-AlOfsub x//Nb Josephson junctions", IEEE Transactions on Applied Superconductivity, IEEE Service Center, Los Alamitos, CA, US, vol. 13, No. 2, Jun. 1, 2003, pp. 123-126.

Vettoliere et al.,"Fine-Tuning and Optimization of Superconducting Quantum Magnetic Sensors by Thermal Annealing",Sensors,vol. 19, No. 17, Aug. 21, 2019, 8 pages.

International Search Report and Written Opinion received for PCT Application Serial No. PCT/EP2019/072500 dated Aug. 28, 2018, 15 pages.

International Search Report and Written Opinion received for PCT Application Serial No. PCT/EP2019/072498 dated Nov. 14, 2019, 13 pages.

Brecht, Teresa, et al."Multilayer microwave integrated quantum circuits for scalable quantum computing." npj Quantum Information, 2, p. 16002. Feb. 23, 2016. 4 pages.

Tan, Yanghong, et al. "Automatic impedance matching and antenna tuning using quantum genetic algorithms for wireless and mobile communications." IET Microwaves, Antennas & Propagation, 7(8), pp. 693-700. 2013. 8 pages.

"Digital Adjustment of DC-DC Converter Output Voltage in Portable Applications." Maxim Integrated. Last Accessed Jul. 30, 2018. 13 pages. https://www.maximintegrated.com/en/app-notes/index.mvp/id/818.

Patra Bishnu, et al. "Cryo-CMOS Circuits and Systems for Quantum Computing Applications." IEEE Journal of Solid-State Circuits. 2018. 13 pages.

Bredendiek, Christian, et al. "Differential Signal Source Chips at 150 GHz and 220 GHz in SiGe Bipolar Technologies Based on Gilbert-Cell Frequency Doublers." Bipolar/BiCMOS Circuits and Technology Meeting (BCTM), 2012 IEEE. 4 pages.

Liu, W.Y., et al. "Superconducting quantum bits." Chinese Physics B, 27(2), p. 027401. 12 pages.

Notice of Allowance received for U.S. Appl. No. 16/114,971 dated Jul. 5, 2019, 27 pages.

Notice of Allowance received for U.S. Appl. No. 16/115,039 dated Aug. 9, 2019, 33 pages.

List of IBM Patents or Applications Treated as Related.

Non-Final Office Action received for U.S. Appl. No. 16/842,096 dated Aug. 7, 2020, 25 pages.

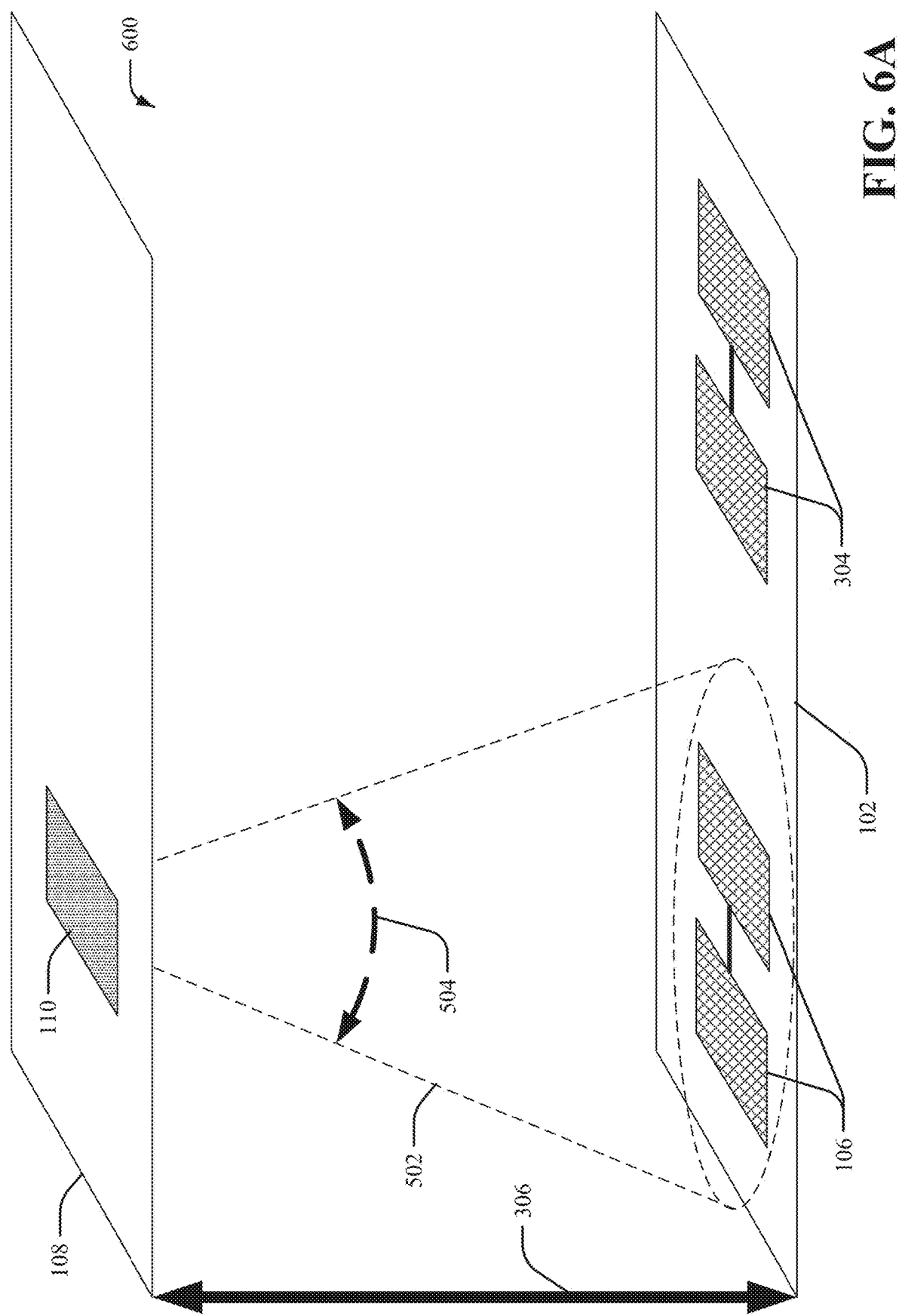

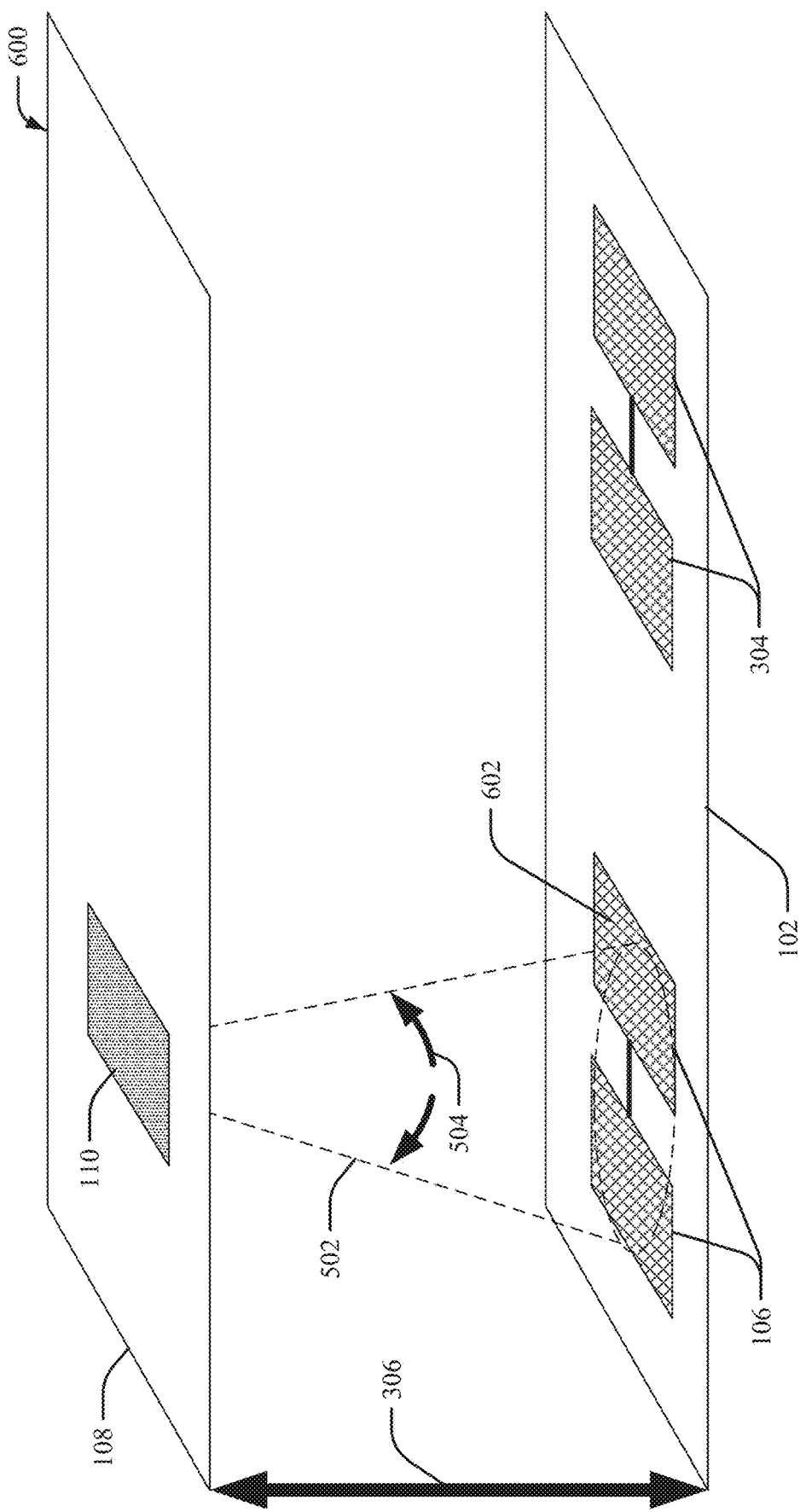

METHODS FOR ANNEALING QUBITS WITH AN ANTENNA CHIP

BACKGROUND

The subject disclosure relates to qubit annealing, and more specifically, to methods for facilitating qubit annealing with an antenna chip. The qubit (e.g., quantum binary digit) is the quantum-mechanical analogue of the classical bit. Whereas classical bits can take on only one of two basis states (e.g., 0 or 1), qubits can take on superpositions of those basis states (e.g., $\alpha|0\rangle + \beta|1\rangle$, where $\alpha$ and $\beta$ are complex scalars such that $|\alpha|^2 + |\beta|^2 = 1$), allowing a number of qubits to theoretically hold exponentially more information than the same number of classical bits. Thus, quantum computers (e.g., computers that employ qubits instead of solely classical bits) can, in theory, quickly solve problems that would be extremely difficult for classical computers. The efficacy of quantum computers can be improved by improving the fabrication and processing of multi-qubit chips. Due to the phenomenon of frequency collision and/or quantum cross-talk (e.g., multiple neighboring qubits having too similar resonant frequencies such that they have undesired interactions with each other), the ability to precisely tune and/or alter qubit frequencies is paramount in the construction of multi-qubit chips. Traditional solutions for such frequency control include tuning of variable-frequency qubits and thermal annealing of fixed-frequency qubits. Variable-frequency qubits have resonant frequencies that can be tuned by exposure to external magnetic fields; however, the additional tuning circuitry required on the qubit chip adds unnecessary complexity and noise. Thermal annealing of fixed-frequency qubits, which involves heating a qubit so as to change its physical properties (e.g., resonant frequency), does not introduce such noise during qubit operation (which is realized at cryogenic temperatures compatible with the superconducting regime). Traditionally, thermal annealing of qubits has been performed by using a photonic chip with a laser source physically routed to different locations on the photonic chip via Mach-Zehnder switches (realized at room temperature or at temperatures outside the superconducting regime). Although parallel annealing of multiple qubits on a multi-qubit chip is possible with such a system, the maximum laser power (e.g., and thus the maximum annealing capability) at each location on the photonic chip depends on the amount of power routed to the other locations on the chip (e.g., if more power from the laser source is routed to location 1, less power from the laser source is available to be simultaneously routed to location 2). Thus, traditional laser annealing of qubits is best suited to serial annealing rather than concurrent/parallel annealing of qubits. Therefore, traditional qubit annealing cannot facilitate independent and/or concurrent localized annealing of one or more qubits on a multi-qubit chip.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate antenna-based qubit annealing are described.

According to one or more embodiments, a system can comprise a superconducting qubit chip having a first qubit, with a first Josephson junction, and a second qubit, with a second Josephson junction. The system can also include an antenna chip positioned above the superconducting qubit chip. A first antenna can be on the antenna chip. The first antenna can direct a first electromagnetic wave toward the first qubit. Furthermore, the system can have a first defined vertical gap, between the first antenna and the superconducting qubit chip. A first length of the first defined vertical gap can be sized to cause the first electromagnetic wave to circumscribe a first set of one or more capacitor pads of the first qubit, thereby annealing the first Josephson junction of the first qubit. An advantage provided by these one or more embodiments is the facilitation of a new technique of thermally annealing one or more qubits (e.g., via antenna-based electromagnetic waves, instead of photonic lasers) that leverages the existing quantum circuitry on the superconducting qubit chip (e.g., anneals qubits without having to modify the existing structure/circuitry of the qubit or qubit chip). An additional advantage of these various embodiments is the facilitation of localized annealing of qubits (e.g., annealing one qubit without unwantedly affecting properties of neighboring qubits). Optionally, in one or more embodiments, the first length of the first defined vertical gap can be a function of a model of a radiation pattern of the first electromagnetic wave as a cone. In such embodiments, the cone can originate from the first antenna on the antenna chip and can extend downward toward the superconducting qubit chip. An advantage provided by these one or more embodiments is to facilitate determining an appropriate distance that can be placed between the first antenna and the superconducting qubit chip so as to reliably perform localized annealing (e.g., such that the first electromagnetic wave circumscribes/envelopes the first set of one or more capacitor pads, thereby annealing the first Josephson junction, and does not circumscribe/envelope a second set of one or more capacitor pads, thereby not annealing the second Josephson junction). Optionally, the system can further comprise a second antenna on the antenna chip. The second antenna can direct a second electromagnetic wave toward the second qubit. Moreover, the system can include a second defined vertical gap, between the second antenna and the superconducting qubit chip. A second length of the second defined vertical gap can be sized to cause the second electromagnetic wave to circumscribe a second set of one or more capacitor pads of the second qubit, thereby annealing the second Josephson junction of the second qubit. An advantage of these one or more embodiments is to facilitate independent and/or concurrent/parallel localized annealing of multiple qubits on a multi-qubit chip (e.g., annealing more than one qubit on the same chip simultaneously and independently, such that each qubit can achieve a distinct level of annealing that can be different from the levels of annealing of neighboring qubits), thereby expediting the overall annealing process to save time as compared to serial annealing, as well as improving frequency allocation and reducing quantum cross-talk.

According to one or more embodiments, a computer-implemented method can comprise directing, via a first antenna on an antenna chip located above a superconducting qubit chip having a first qubit and a second qubit, a first electromagnetic wave toward the first qubit. The computer-implemented method can also comprise annealing, by the first antenna, a first Josephson junction of the first qubit based on the directing. Furthermore, a first length of a first defined vertical gap between the first antenna and the superconducting qubit chip can cause the first electromagnetic wave to circumscribe a first set of one or more capacitor pads of the first qubit. This can thereby heat the first Josephson junction of the first qubit. Additionally, the computer-implemented method can include moving the antenna chip to a second superconducting qubit chip in a manufacturing line to facilitate annealing of qubits on the second superconducting qubit chip. Such moving can be facilitated via a micromanipulator, a piezocontroller, or a temporary attachment between the antenna chip and the superconducting qubit chips. An advantage of these one or more embodiments is to facilitate a new technique of thermally annealing qubits that leverages existing quantum circuitry on the superconducting qubit chip (e.g., elimination of need to alter existing quantum circuitry on the superconducting qubit chip). An additional advantage provided by these various embodiments is to facilitate localized annealing of qubits (e.g., annealing one qubit without unwantedly annealing and/or affecting neighboring qubits on the superconducting qubit chip). Optionally, in one or more embodiments, the first length of the first defined vertical gap can be a function of a model of a radiation pattern of the first electromagnetic wave as a cone. In such embodiments, the cone can originate from the first antenna and can extend downward toward the superconducting qubit chip. An advantage of these one or more embodiments is to facilitate determining an appropriate distance to place between the first antenna and the superconducting qubit chip so as to reliably perform localized qubit annealing (e.g., annealing a target qubit/Josephson junction without accidentally affecting neighboring qubits/Josephson junctions). Optionally, in one or more embodiments, the computer-implemented method can further include directing, via a second antenna on the antenna chip, a second electromagnetic wave toward the second qubit. Moreover, the computer-implemented method can comprise annealing, by the second antenna, a second Josephson junction of the second qubit based on the directing of the second electromagnetic wave. In some embodiments, a second length of a second defined vertical gap between the second antenna and the superconducting qubit chip can cause the second electromagnetic wave to circumscribe a second set of one or more capacitor pads of the second qubit. This can thereby heat the second Josephson junction of the second qubit. An advantage of these one or more embodiments is to facilitate independent and concurrent (or sequential) localized annealing of multiple qubits on a multi-qubit chip (e.g., simultaneously annealing more than one qubit on a multi-qubit chip, such that each qubit on the chip can achieve a distinct level of annealing, and such that the distinct levels of annealing of the various qubits on the chip can be different).

According to one or more embodiments, a device can comprise a superconducting qubit chip having a first Josephson junction and a second Josephson junction. The device can also comprise an antenna chip above the superconducting qubit chip. A first antenna can be on the antenna chip and can emit a first electromagnetic wave toward the first Josephson junction. A second antenna can be on the antenna chip and can emit a second electromagnetic wave toward the second Josephson junction. Moreover, the device can include a micromanipulator, a piezocontroller, or a temporary attachment that can position the antenna chip above the superconducting qubit chip, with a defined vertical gap between the antenna chip and the superconducting qubit chip. A length of the defined vertical gap can be sized by the micromanipulator, piezocontroller, or temporary attachment to cause the first electromagnetic wave to circumscribe the first Josephson junction, thereby annealing the first Josephson junction, and to cause the second electromagnetic wave to circumscribe the second Josephson junction, thereby annealing the second Josephson junction. An advantage of these one or more embodiments is to facilitate a new technique of qubit annealing that makes use of existing quantum circuitry on a superconducting qubit chip, thereby eliminating the need to retrofit the chip with specialized annealing/tuning circuitry. Another advantage of these various embodiments is to facilitate precise, accurate, and reliable positioning of the antenna above the superconducting qubit chip by the micromanipulator, piezocontroller, or temporary attachment, thereby enabling reliable and repeatable annealing of qubits via the antenna chip. Optionally, in one or more embodiments, the length of the defined vertical gap can be approximately equal to a height of a cone. A base of the cone can circumscribe the first Josephson junction. Additionally, an apex angle of the cone can be approximately equal to a three-decibel angular beam width of a main lobe of a radiation pattern of the first electromagnetic wave. An advantage of these one or more embodiments is to facilitate determining an appropriate distance to place between the antenna chip and the superconducting qubit chip to effectively and reliably perform localized annealing (e.g., purposely annealing at least one qubit without unwantedly affecting neighboring qubits).

According to one or more embodiments, a computer-implemented method can comprise positioning, via a micromanipulator, a piezocontroller, or a temporary attachment, an antenna chip above a superconducting qubit chip having a first Josephson junction and a second Josephson junction. There can be a defined vertical gap between the antenna chip and the superconducting qubit chip. Additionally, the computer-implemented method can include emitting, by the antenna chip, an electromagnetic wave toward the first Josephson junction. The computer-implemented method can further comprise annealing, by the antenna chip, the first Josephson junction based on the emitting. A length of the defined vertical gap can be sized by the micromanipulator, piezocontroller, or temporary attachment to cause the electromagnetic wave to circumscribe the first Josephson junction. An advantage of these one or more embodiments is to facilitate a new technique of qubit annealing that makes use of existing quantum circuitry on a superconducting qubit chip, thereby eliminating the need to retrofit the chip with specialized annealing/tuning circuitry. Another advantage of these various embodiments is to facilitate localized annealing of qubits (e.g., annealing at least one qubit on a multi-qubit chip without accidentally annealing neighboring qubits on the multi-qubit chip). Optionally, in one or more embodiments, the length of the defined vertical gap can be a function of a model of a radiation pattern of the electromagnetic wave as a cone. The cone can originate from the antenna chip and can extend toward the superconducting qubit chip. An advantage of these one or more embodiments is to facilitate determining how far the antenna chip can be from the superconducting qubit chip so as to reliably perform localized annealing.

According to one or more embodiments, a computer-implemented method can comprise positioning, by a system, an antenna chip having an antenna above a first superconducting qubit chip having a first Josephson junction. The computer-implemented method can also include annealing, by the antenna, the first Josephson junction by emitting, via the antenna, a first electromagnetic wave toward the first Josephson junction. In various embodiments, the computer-implemented method can further comprise positioning, by the system, the antenna chip above a second superconducting qubit chip having a second Josephson junction. The computer-implemented method can also include annealing, by the antenna, the second Josephson junction by emitting, via the antenna, a second electromagnetic wave toward the second Josephson junction. An advantage of these one or more embodiments is to facilitate a reliable and repeatable annealing process across multiple superconducting qubit chips that are queued for annealing (e.g., for use in a qubit manufacturing line).

DESCRIPTION OF THE DRAWINGS

FIGS. 6A-6C illustrate perspective schematics of an example, non-limiting system that facilitates localized antenna-based qubit annealing with a defined vertical gap in accordance with one or more embodiments described herein.

DETAILED DESCRIPTION

Figure 1A:
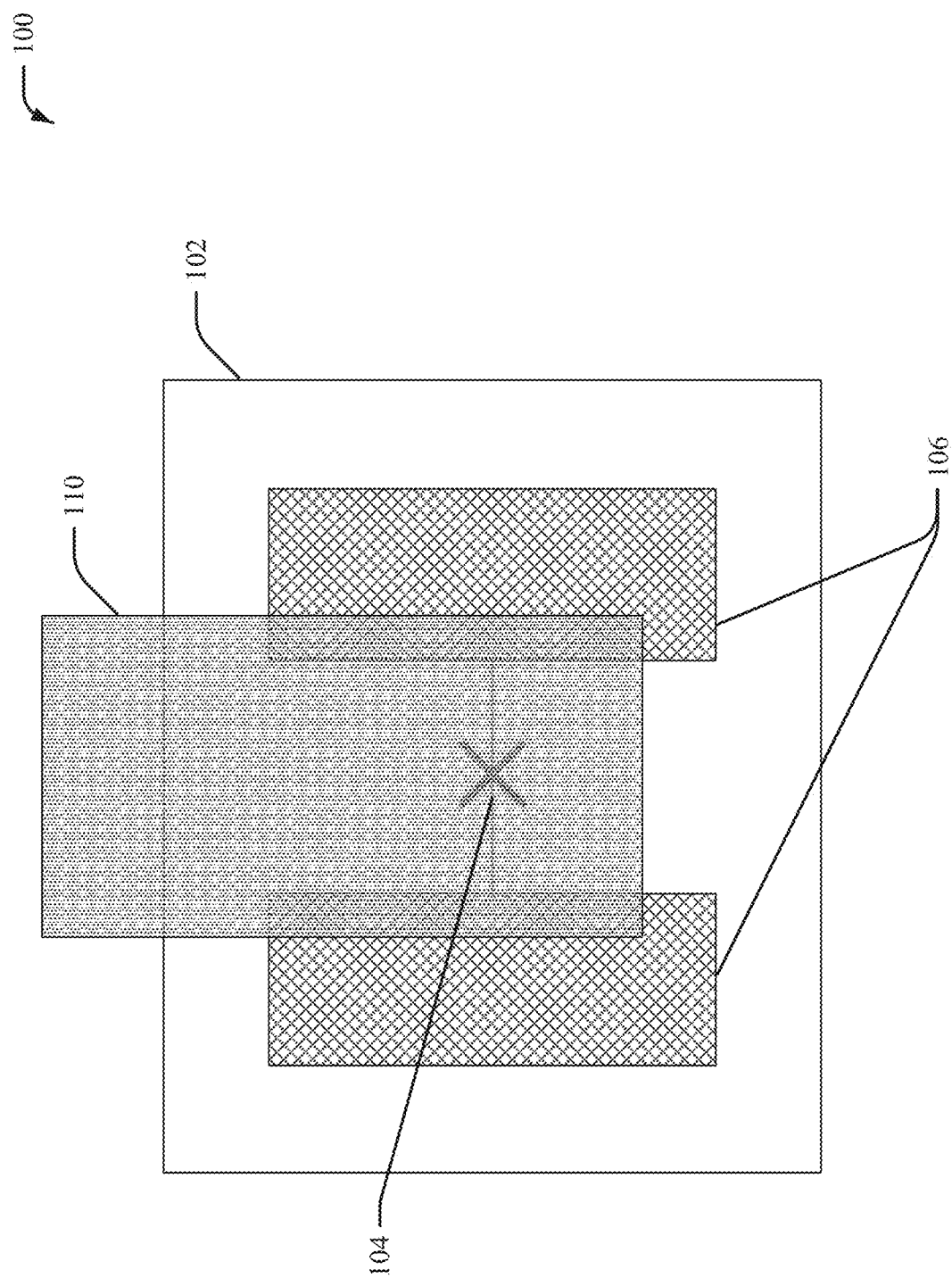
FIGS. 1A and 1B respectively illustrate a top-view schematic and a side-view schematic of an example, non-limiting system that facilitates antenna-based qubit annealing in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Superconducting qubits offer a promising path toward constructing fully-operational quantum computers. This is because they can exhibit quantum-mechanical behavior (allowing them to be used for quantum information processing) at the macroscopic level (allowing them to be designed and fabricated by existing integrated circuit technologies). The fundamental building-block of superconducting qubits is the Josephson junction. Josephson junctions can be formed by sandwiching a non-superconducting material between two superconducting materials, and can be modified by thermal annealing (e.g., heat treating). The annealing of a qubit (e.g., annealing a qubit's Josephson junction) can change a transition frequency of the qubit (e.g., a resonant frequency marking the transition between a qubit's ground state and an excited state). Such manipulation of qubit transition frequencies can enable optimized frequency allocation, thereby minimizing frequency collisions and/or quantum cross-talk. For example, multiple qubits on a multi-qubit chip can be individually/independently annealed such that each qubit has a distinct transition frequency from those of its neighboring qubits, thereby decreasing the likelihood of neighboring qubits inappropriately responding to a computational and/or control signal meant to induce a response in only a certain qubit. Concurrent and localized annealing of qubits would thus benefit the operation of multi-qubit chips. However, a problem in the prior art is that there is no known scalable method/system for performing such concurrent and localized qubit annealing to modify qubit frequencies.

Various embodiments of the present invention can provide solutions to this problem in the art. One or more embodiments described herein include systems, computer-implemented methods, apparatus, and/or computer program products that facilitate concurrent and localized qubit annealing. More specifically, one or more embodiments pertaining to methods for concurrent and/or localized qubit-annealing using antennas and/or electromagnetic emitters are described. For example, in one or more embodiments, a radio frequency emitter/antenna can emit an electromagnetic signal/wave onto a set of one or more capacitor pads of a Josephson junction, wherein the Josephson junction is a component of a qubit on a superconducting qubit chip. The set of one or more capacitor pads can receive the electromagnetic signal/wave; that is, each pad can function as a receiving antenna (e.g., a patch antenna). Based on receipt by the set of one or more capacitor pads, the electromagnetic signal can induce an alternating current and/or voltage in the set of one or more capacitor pads and/or at or within a defined distance from the Josephson junction (e.g., in the circuit lines electrically coupling the pads to the Josephson junction). This alternating current/voltage can heat the Josephson junction. Such heating can affect the properties of the Josephson junction, thereby modifying a transition frequency of the qubit. Thus, localized qubit annealing can be performed without having to add and/or subtract circuitry to/from the superconducting qubit chip. In one or more other embodiments, multiple electromagnetic emitters/antennas can be implemented concurrently so as to perform localized annealing on multiple qubits simultaneously. Thus, various embodiments of the present invention can address problems in the art by facilitating independent and concurrent (or sequential) localized annealing of one or more qubits on a multi-qubit chip.

The embodiments described herein relate to systems, computer-implemented methods, apparatus, and/or computer program products that employ highly technical hardware and/or software to technologically solve technological problems in the field of qubit annealing (e.g., thermal annealing of qubits).

Specifically, the field of qubit annealing (which is entirely distinct and separate from the field of quantum annealing) suffers from a lack of scalable and efficient systems and/or computer-implemented methods for individually, independently, and/or concurrently annealing one or more superconducting qubits on a superconducting qubit chip. As described thoroughly below, one or more embodiments of the present invention can address this technical problem by providing a scalable and efficient system and/or computer-implemented method that utilizes one or more electromagnetic transmitters/antennas to excite sets of one or more capacitor pads of one or more superconducting qubits on a superconducting qubit chip. The electromagnetic transmitters/antennas can emit electromagnetic radiation (e.g. an electromagnetic wave and/or signal) onto the capacitor pads of a qubit, thereby heating (and therefore annealing) the qubit. Moreover, a defined vertical gap between the transmitter/antenna and the superconducting qubit chip can be sized so as to cause the electromagnetic signal/wave to circumscribe/envelope capacitor pads of a target qubit/Josephson junction, thereby annealing the target qubit/Josephson junction, and to avoid circumscribing/enveloping capacitor pads of neighboring qubits/Josephson junctions, thereby avoiding unwanted/accidental annealing of the neighboring qubits/Josephson junctions.

In one or more embodiments, one or more emitters/antennas can correspond in a one-to-one fashion to one or more qubits on the superconducting qubit chip, wherein each emitter/antenna can be individually and/or independently voltage and/or frequency tunable. That is, each emitter/antenna can be controlled so as to manipulate a duration, a frequency, and/or a magnitude of the electromagnetic wave that it can generate. Each wave/signal can then induce a distinct amount of annealing of the qubit onto which it is emitted. So, each qubit can be individually and/or independently annealed (e.g., by adjusting the voltage and/or frequency of its corresponding emitter/antenna) such that it receives a unique and/or defined level of annealing as compared to its neighboring qubits on the superconducting qubit chip. In other words, each of the qubits can achieve a defined level of annealing via the systems and/or computer-implemented methods disclosed herein. For example, one or more embodiments can facilitate annealing a first qubit by a first electromagnetic signal for a first time period, and annealing a second qubit by a second electromagnetic signal for a second time period, wherein the two time periods can be of the same length and/or of different lengths, and/or wherein the two signals can be of the same frequencies, wavelengths, and/or magnitudes and/or of different frequencies, wavelengths, and/or magnitudes. Moreover, the one or more emitters/antennas can operate concurrently, thereby facilitating independent and/or concurrent (or sequential) localized annealing of the one or more qubits (e.g., annealing a first qubit for a first time period, and annealing a second qubit for a second time period, wherein the two time periods can be overlapping and/or non-overlapping). Such concurrent and localized annealing addresses problems in the prior art by saving time as compared to serial annealing and improving operation/functionality of multi-qubit chips by eliminating frequency collisions and/or quantum crosstalk.

Not only can the disclosed systems and/or computer-implemented methods efficiently and precisely anneal superconducting qubits individually and concurrently, but they can also do so without having to change, modify, and/or otherwise adapt the quantum circuitry of the qubits and/or the superconducting qubit chip. For example, there is no need to physically solder, build through a manufacturing process, couple, and/or etch extra capacitors, inductors, resistors, and/or any other circuitry to the qubit to be annealed. Instead, one or more embodiments disclosed herein can facilitate qubit annealing by leveraging the existing quantum circuitry on the superconducting qubit chip (e.g., emitting electromagnetic waves/signals onto existing capacitor pads that are already coupled to a Josephson junction). Thus, the prior art problem of having to incorporate additional tuning circuitry to tune qubit frequencies can be eliminated.

The above-mentioned technical improvements, which are more thoroughly described below, are not abstract, are not merely laws of nature or natural phenomena, and cannot be performed by humans without the use of specialized, specific, and concrete hardware and/or software (e.g., electromagnetic emitters/antennas, emitting electromagnetic signals onto transmon capacitor pads, and so on).

Figure 1B:
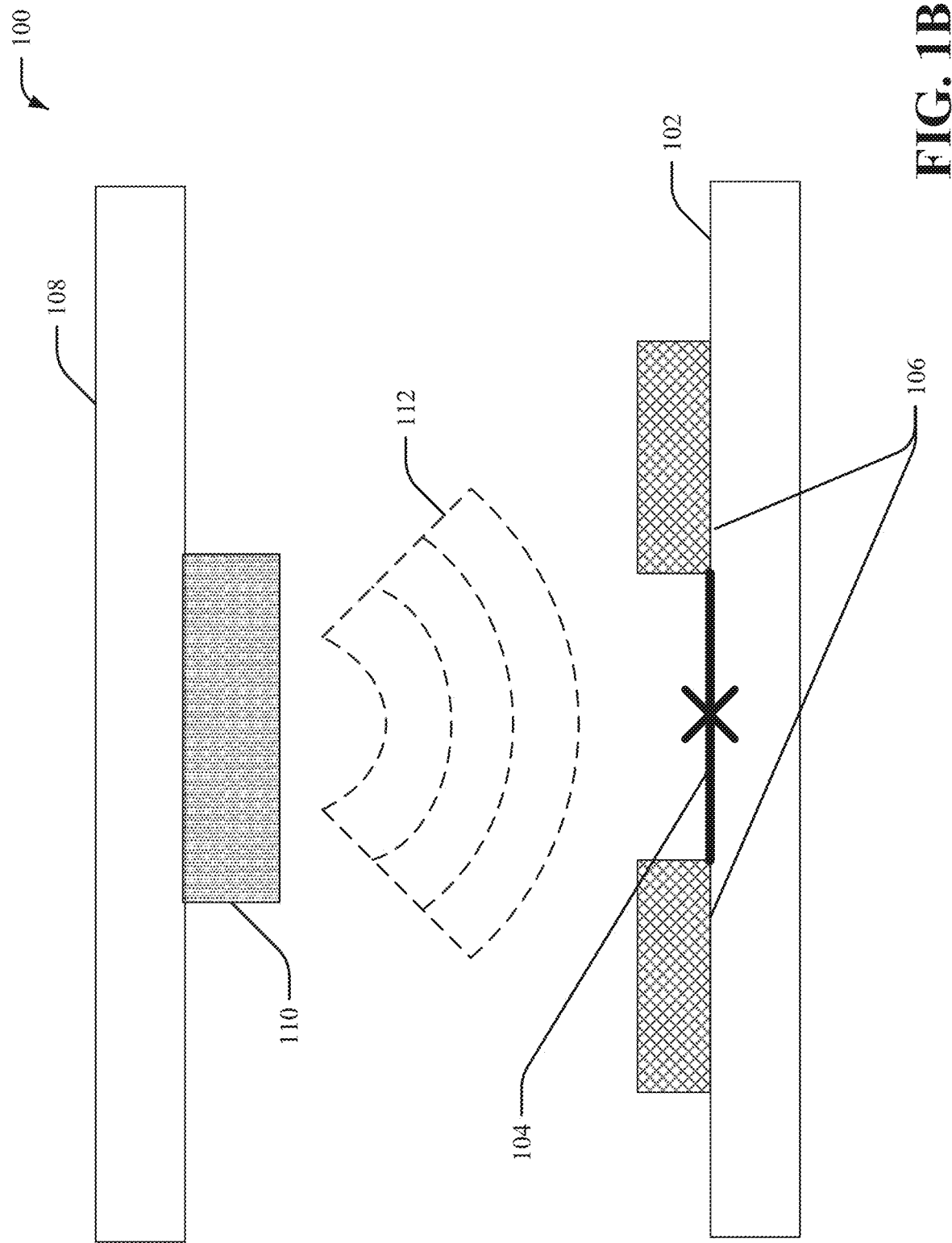

Now, consider the drawings. FIGS. 1A and 1B respectively illustrate a top-view schematic and a side-view schematic of an example, non-limiting system that facilitates antenna-based qubit annealing in accordance with one or more embodiments described herein. With reference now to FIGS. 1A and 1B, there is illustrated an example system 100 that can facilitate antenna-based qubit annealing of qubits on a superconducting qubit chip 102. In various embodiments, the system 100 can be used to facilitate antenna-based annealing of qubits/Josephson junctions on the superconducting qubit chip 102 regardless of the fabrication stage of the qubits/Josephson junctions. That is, in one or more embodiments, the system 100 can be an antenna-based qubit annealing system that anneals qubits/Josephson junctions on the superconducting qubit chip 102, wherein the system 100 can be used for post-fabrication, pre-fabrication, and/or mid-fabrication processing/annealing of the qubits/Josephson junctions. For example, the superconducting qubit chip 102 can be fully etched/outfitted with qubits, quantum readout resonators, and/or other quantum circuitry such that the superconducting qubit chip 102 is fully-fabricated and ready to be implemented in a quantum computer once a defined level of annealing is accomplished. In other embodiments, the qubits/Josephson junctions on the superconducting qubit chip 102 can undergo additional fabrication/processing after being annealed by the system 100. In still other embodiments, the system 100 can be incorporated into a dedicated qubit-production and/or Josephson-junction-production process, wherein the superconducting qubit chip 102 is a dedicated platform/substrate on which one or more qubits/Josephson junctions are constructed, and wherein the qubits/Josephson junctions are removed from the superconducting qubit chip 102 after annealing to be incorporated into other quantum computing chips.

In one or more embodiments, the superconducting qubit chip 102 can be a printed circuit board comprising one or more sheets/layers of conducting material (e.g., such as copper) laminated onto and/or between one or more sheets/layers of one or more non-conducting substrates. In various embodiments, any suitable conductors and/or non-conducting substrates known in the art can be used. In other embodiments, the superconducting qubit chip 102 can be any platform known in the art that is suitable to carry one or more superconducting qubits. Regardless of its construction, the superconducting qubit chip 102 can have on it one or more superconducting qubits, with a superconducting qubit comprising at least one Josephson junction.

As shown in FIG. 1A, the superconducting qubit chip 102 can have on it a superconducting qubit, wherein the superconducting qubit can comprise a Josephson junction 104 (marked with "X" in the drawings) and a set of one or more capacitor pads 106. The set of one or more capacitor pads 106 can comprise any capacitor pad construction known in the art. The Josephson junction 104 can be created by coupling two superconductors together via a weak link. As mentioned above, this can be accomplished by sandwiching a thin layer of non-superconducting material between two layers of superconducting material, wherein the layer of non-superconducting material is the weak link (e.g., S-N-S Josephson junction). This can also be accomplished by separating the superconductors with a thin insulating barrier, wherein the insulating barrier is the weak link (e.g., S-I-S Josephson junction). Additionally, this can be accomplished by applying a physical constriction at the point of contact between the two superconductors, wherein the constricted point is the weak link (e.g., S-s-S Josephson junction). Moreover, since the Josephson junction 104 is a macroscopic structure, it can be constructed by known integrated circuit technologies and/or techniques (e.g., photolithography, deposition, sputtering, evaporation, doping, and so on).

The Josephson junction 104 can exhibit a Cooper-pair quantum tunneling effect (e.g., electrons tunneling through the weak link in the absence of an applied voltage), thereby allowing for the flow of a supercurrent (e.g., electrical current flowing without resistance/dissipation) across the junction at sufficiently low temperatures. This quantum-mechanical behavior at the macroscopic level can allow the Josephson junction 104 to function as (or as part of) a qubit (e.g., a device that can occupy discrete/quantized energy states as well as superpositions of those energy states). In one or more embodiments, the Josephson junction 104 can be a component of a transmon qubit (e.g., a type of charge qubit), the quantized energy states of which can correspond to integer numbers of Cooper-paired electrons that have crossed the Josephson junction 104 and/or are present on a superconducting island formed in part by the Josephson junction 104. In other embodiments, the Josephson junction 104 can be a component of other types of qubits, such as a flux qubit (e.g., the quantized energy states of which can correspond to integer numbers of magnetic flux quanta penetrating a superconducting loop formed in part by the Josephson junction 104), a phase qubit (e.g., the quantized energy states of which can correspond to quantum charge oscillation amplitudes across the Josephson junction 104), and so on. In any case, properties of the Josephson junction 104 can affect the transition frequencies between these quantized energy states, and so annealing (e.g., heat treating) of the Josephson junction 104 can be implemented to tune, modify, and/or alter transition frequencies of a qubit comprising the Josephson junction 104. As mentioned above, such tuning, modification, and/or alteration can be implemented to reduce frequency collision and/or quantum crosstalk between multiple qubits, thereby improving the functionality and/or operation of multi-qubit chips.

Now, the drawings depict a transmon qubit design; that is, a superconducting qubit in which the Josephson junction 104 is coupled in parallel to a capacitor, which has a set of one or more capacitor pads 106 (also called "transmon capacitor pads 106," "capacitor pads 106," and/or "pads 106"). However, those of skill in the art will appreciate that one or more embodiments of the invention can incorporate other capacitor pad configurations (e.g. serial and/or parallel coupling) and not solely the transmon configuration. Some non-limiting examples of other qubit designs that can be used with the qubit-annealing system 100 include other types of charge qubits, phase qubits, flux qubits, fluxonium qubits, xmon qubits, quantronium qubits, and so on. In other words, even though the present disclosure explicitly discusses the details of how existing quantum circuitry of a transmon qubit (e.g., transmon capacitor pads 106) can be leveraged to perform localized annealing of the transmon qubit, those of skill in the art will appreciate that the systems and/or computer-implemented methods described herein can be implemented to leverage the existing quantum circuitry in other qubit designs to similarly facilitate annealing of those other qubits. For example, the systems and/or computer-implemented methods described herein can be implemented in conjunction with any type of quantum circuitry component, which can receive electromagnetic signals/waves as an antenna, to facilitate qubit annealing.

Moreover, even though FIGS. 1A and 1B depict a qubit having only a single Josephson junction 104 and a single set of capacitor pads 106, those of skill in the art will understand that a qubit on the superconducting qubit chip 102 can comprise any number of Josephson junctions 104 and/or any number of capacitor pads 106. Furthermore, although FIGS. 1A and 1B depict only a single superconducting qubit on the superconducting qubit chip 102, those of skill in the art will appreciate that any number of superconducting qubits can be positioned on the superconducting qubit chip 102. Similarly, those of skill in the art will understand that additional quantum circuitry (e.g., readout resonators, flux bias lines, and so on) can be incorporated onto the superconducting qubit chip 102, wherein such additional quantum circuitry is conductively, capacitively, and/or inductively coupled to the Josephson junction 104 and/or the set of one or more capacitor pads 106.

In one or more embodiments, the system 100 can include an emitter chip 108 (also called antenna chip 108 or semiconductor chip 108, and not depicted in FIG. 1A) and a radio frequency (RF) emitter 110 (also called antenna 110) on the emitter chip 108. The emitter chip 108 can employ a printed circuit board construction and/or any other computer chip construction known in the art such that the RF emitter/ antenna 110 can be operably soldered, etched, and/or attached onto the emitter chip 108. As shown in FIG. 1B, the emitter chip 108 can be positioned above, mounted above, mounted on, and/or mounted onto the superconducting qubit chip 102, such that the RF emitter/antenna 110 is above the superconducting qubit chip 102. In one or more other embodiments, the RF emitter/antenna 110 can be positioned directly or substantially directly vertically above the Josephson junction 104 and/or the set of one or more capacitor pads 106 (as shown in FIG. 1B). In still other embodiments, the RF emitter/antenna 110 can be positioned such that it is above the superconducting qubit chip 102 and not directly or substantially directly vertically above the Josephson junction 104 and/or the set of one or more capacitor pads 106.

As depicted in FIG. 1B, the RF emitter/antenna 110 can emit, generate, localize, and/or direct an electromagnetic signal/wave 112 toward, on, and/or onto the set of one or more capacitor pads 106. In some embodiments, the RF emitter/antenna 110 can be a microstrip antenna (e.g., a patch antenna) that can be etched, soldered, and/or otherwise attached onto the emitter chip 108. In one or more other embodiments, the RF emitter/antenna 110 can be a dipole antenna, a monopole antenna, an array antenna, a loop antenna, an aperture antenna, a horn antenna, a parabolic antenna, a plasma antenna, and so on. In still other embodiments, the RF emitter/antenna 110 can be any device, antenna, and/or signal generator known in the art and that can propagate an electromagnetic signal/wave through space/air (and/or otherwise across a medium lacking electrical conductors).

In one or more embodiments, the RF emitter/antenna 110 can be voltage and/or frequency tunable. That is, the RF emitter/antenna 110 can be controlled/manipulated (e.g., by controlling/manipulating an input alternating current and/or voltage that is fed to the RF emitter/antenna 110 to generate the propagating electromagnetic signal/wave 112) so as to control/manipulate the characteristics of the electromagnetic signal/wave 112. In some embodiments, the RF emitter/antenna 110 can control a duration, a frequency, and/or a magnitude of the electromagnetic signal/wave 112 to generate a defined level of the annealing of the Josephson junction 104. For example, the input alternating current and/or voltage that is fed to the RF emitter/antenna 110 to generate the propagating electromagnetic signal/wave 112 can be ceased (e.g., set to zero) to stop/cease the emitting of the electromagnetic signal/wave 112. Thus, the RF emitter/ antenna 110 can control a duration of the electromagnetic signal/wave 112 by ceasing the emitting based on achieving the defined level of annealing (e.g., ceasing the emitting after a defined period of time has elapsed from the RF emitter 110 beginning to emit the electromagnetic signal/ wave 112). As another example, the oscillation frequency of the input alternating current and/or voltage that is fed to the RF emitter/antenna 110 to generate the propagating electromagnetic signal/wave 112 can be increased, decreased, and/or otherwise controlled in order to increase, decrease, and/or otherwise control a frequency and/or wavelength of the electromagnetic signal/wave 112. Thus, the RF emitter/ antenna 110 can control a frequency and/or wavelength of the electromagnetic signal/wave 112 to hasten and/or slow the annealing of the Josephson junction 104. As yet another example, the magnitude of the input alternating current and/or voltage that is fed to the RF emitter/antenna 110 to generate the propagating electromagnetic signal/wave 112 can be increased, decreased, and/or otherwise controlled in order to increase, decrease, and/or otherwise control a magnitude of the electromagnetic signal/wave 112. Thus, the RF emitter/antenna 110 can control a magnitude of the electromagnetic signal/wave 112 to hasten and/or slow the annealing of the Josephson junction 104. In one or more embodiments, the RF emitter/antenna 110 can comprise one or more voltage-controlled oscillators that can be used to generate voltage tunable, current tunable, and/or frequency tunable signals to enable the RF emitter/antenna 110 to generate and control the electromagnetic signal/wave 112. In some embodiments, the electromagnetic signal/wave 112 can have a frequency that is greater than or equal to 150 GigaHertz (e.g., belonging to the microwave region of the electromagnetic spectrum (such as between 300 KiloHertz and 300 GigaHertz)). In some embodiments, the electromagnetic signal/wave 112 can have a maximum power of 1 Watt to limit damage to Josephson junctions.

In one or more embodiments, the RF emitter/antenna 110 can emit/generate the electromagnetic signal/wave 112 such that the electromagnetic signal/wave 112 is substantially isotropic (e.g., the electromagnetic signal/wave 112 is radiated with substantially equal strength in every direction, thereby having a substantially spherical radiation pattern). In one or more other embodiments, the RF emitter/antenna 110 can emit/generate and/or localize/direct the electromagnetic signal/wave 112 such that the electromagnetic signal/wave 112 is omnidirectional (e.g., the electromagnetic signal/ wave 112 is radiated substantially symmetrically with respect to a given axis, thereby having a substantially torus-like radiation pattern). In still one or more other embodiments, the RF emitter/antenna 110 can emit/generate and/or localize/direct the electromagnetic signal/wave 112 such that the electromagnetic signal/wave 112 is directional (e.g., the electromagnetic signal/wave 112 is radiated more strongly in a given direction than in other directions, thereby having a radiation pattern with at least one main lobe). In any case, the electromagnetic signal/wave 112 can be emitted by the RF emitter/antenna 110 toward, onto, and/or on the set of one or more capacitor pads 106.

As shown in FIG. 1B, in one or more embodiments, the set of one or more capacitor pads 106 can receive and/or capture the electromagnetic signal/wave 112 as the electromagnetic signal/wave 112 propagates through space/air. In such case, each pad of the set of one or more capacitor pads 106 can function as a receiving antenna (e.g., a receiving patch antenna) that responds to being exposed to the electromagnetic signal/wave 112. As described below, the reception of the electromagnetic signal/wave 112 by the capacitor pads 106 can cause annealing of the Josephson junction 104. Although the present disclosure explicitly describes qubit annealing by leveraging existing capacitor pads (e.g., the set of one or more capacitor pads 106) that are coupled to the qubit (e.g., coupled to the Josephson junction 104), those of skill in the art will appreciate that any existing circuitry that is on the superconducting qubit chip 102, that is capacitively, conductively, and/or inductively coupled to a Josephson junction, and that can receive electromagnetic radiation, waves, and/or signals propagating through space/air can be leveraged to implement one or more embodiments of the present invention.

Figure 2:
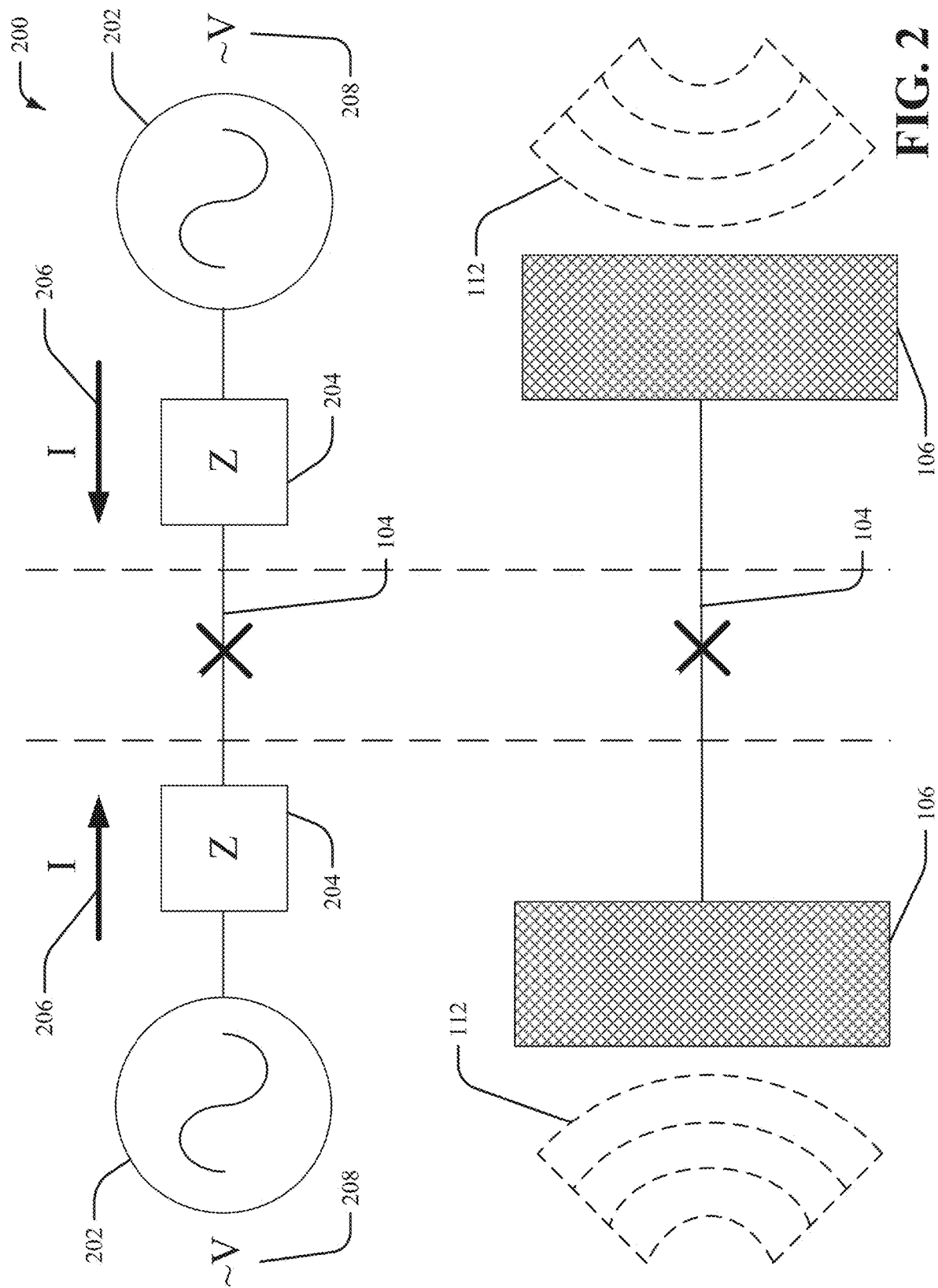
FIG. 2 illustrates an equivalent circuit diagram of an example, non-limiting system that facilitates antenna-based qubit annealing in accordance with one or more embodiments described herein.

To better understand how the set of one or more capacitor pads 106 (and/or any other circuitry on the superconducting qubit chip 102 that can receive the electromagnetic signal/ wave 112) can facilitate annealing of the Josephson junction 104, consider FIG. 2. FIG. 2 illustrates an equivalent circuit diagram of an example, non-limiting system that facilitates antenna-based qubit annealing in accordance with one or more embodiments described herein. With reference now to FIG. 2, there is illustrated an example circuit diagram 200 that shows how the capacitor pads 106 and the Josephson junction 104 respond upon receiving the electromagnetic signal/wave 112.

First, consider a high-level explanation. As shown, even though the capacitor pads 106 make up a capacitor that is coupled in parallel to the Josephson junction 104, the separate pads of the set of one or more capacitor pads 106 (each labeled 106 in FIG. 2) can be considered as individually coupled in series (instead of collectively in parallel) with the Josephson junction 104. As mentioned above, each pad 106 can function as a receiving antenna, thereby receiving/capturing the electromagnetic signal/wave 112. Based on receiving the electromagnetic signal/wave 112, the capacitor pads 106 can generate an alternating current and/or voltage at or within a defined distance from the Josephson junction 104 (e.g., in the circuit lines electrically coupling the set of capacitor pads 106 to the Josephson junction 104). The generated alternating current and/or voltage can then heat the Josephson junction 104, thereby annealing the Josephson junction 104.

Now, consider a more detailed explanation. As mentioned above, the individual pads of the set of capacitor pads 106 can be thought of as being individually coupled in series to the Josephson junction 104. As also mentioned above, each pad 106 can receive/capture the electromagnetic signal/wave 112, thereby functioning as a receiving antenna. When exposed to the electromagnetic signal/wave 112, the electrons in each of the capacitor pads 106 can begin to oscillate according to the characteristics/properties (e.g., frequency, wavelength, amplitude, magnitude, and so on) of the electromagnetic signal/wave 112. This oscillation of electrons in the set of capacitor pads 106 can generate/induce an alternating current 206 and/or an alternating voltage 208 in each pad 106, wherein the alternating current 206 and/or the alternating voltage 208 have substantially the same (and/or related) frequency and/or magnitude as the electromagnetic signal/wave 112. Thus, each separate pad 106, based upon excitation by the electromagnetic signal/wave 112, can be considered a separate oscillating signal source 202 (e.g., an alternating current and/or voltage source), wherein each oscillating signal source 202 can generate an alternating current 206 and/or an alternating voltage 208. Because FIG. 2 depicts two separate pads 106, FIG. 2 depicts two corresponding oscillating signal sources 202, each one generating an alternating current 206 and/or an alternating voltage 208. However, those of skill in the art will appreciate that additional and/or fewer capacitor pads (and therefore oscillating signal sources) can be incorporated. Overall, the effect of emitting, via the RF emitter/antenna 110, the electromagnetic signal/wave 112 onto the set of one or more capacitor pads 106 is to cause each pad 106 to separately replicate (or substantially replicate) the electromagnetic signal/wave 112 as an alternating current 206 and/or an alternating voltage 208 that flows through the pads 106 themselves and through the circuit lines coupling the capacitor pads 106 to the Josephson junction 104, rather than as waves/signals propagating through space/air.

In one or more embodiments, the frequency and/or magnitude of the electromagnetic signal/wave 112 can be controlled so as to control the frequency and/or magnitude of the alternating current 206 and/or the alternating voltage 208. In some embodiments, the magnitude of the alternating voltage 208 can be limited to no more than 50 millivolts so as to avoid damaging the Josephson junction 104.

Now, each alternating current 206 and/or alternating voltage 208 is generated at a corresponding oscillating signal source 202 (e.g., at a corresponding pad 106) and can run from the corresponding oscillating signal source 202 to the Josephson junction 104 through the circuit lines electrically connecting the corresponding oscillating signal source 202 to the Josephson junction 104. In FIG. 2, "Z" represents the impedance 204 from each oscillating signal source 202 to the Josephson junction 104 (that is, impedance from each pad 106 to the junction 104). In some embodiments, the capacitor pads 106 can be symmetric, and so the two impedances 204 can be equal. In such case, the complex formulation of Ohm's law (e.g., V=I*Z) yields that the two alternating currents 206 can also be equal, and can add up at the Josephson junction 104 (since the two alternating currents 206 run in opposite directions, as shown in FIG. 2). In other embodiments, the pads 106 can be asymmetric, and so the two impedances 204 can be unequal. In such case, the complex formulation of Ohm's law yields that the two alternating currents 206 can also be unequal, and thus can partially cancel at the Josephson junction 104. In either scenario, the alternating currents 206 oscillate back and forth through the circuit lines leading from the oscillating signal sources 202 (e.g., from the capacitor pads 106) to the Josephson junction 104, and such oscillation can continue for as long as the RF emitter/antenna 110 emits the electromagnetic signal/wave 112.

As known from the complex power equation (e.g., P=V*I), the oscillation of the alternating current 206 can dissipate power in the form of heat, thereby heating the circuit lines connecting the oscillating signal sources 202 to the Josephson junction 104. The oscillating signal sources 202 (e.g., the pads 106) can, themselves, also heat up during this oscillation. This heating of the capacitor pads 106 and the lines coupling the capacitor pads 106 to the Josephson junction 104 can then heat the Josephson junction 104 (e.g., via thermal conduction). Such heating can alter the physical and/or electrical properties of the Josephson junction 104 (e.g., its critical current, its normal state resistance, and so on), thereby correspondingly altering a transition frequency of the qubit comprising the Josephson junction 104. That is, various embodiments of the present invention can leverage the existing quantum circuitry on the superconducting qubit chip to anneal qubits, thereby addressing/solving the prior art problem of having to incorporate specialized tuning circuitry onto the superconducting qubit chip to tune qubit frequencies.

The Josephson junction 104 can be heated in this way to achieve a defined and/or desired level of annealing. As one of skill in the art will understand, the defined level of annealing can be based on a defined and/or desired transition frequency which the Josephson junction 104 is to achieve. For example, if the Josephson junction 104 is to have a transition frequency of A, then it must be annealed at B intensity for C amount of time. The duration, frequency, and/or magnitude of the electromagnetic signal/wave 112 can be controlled/adjusted so as to provide the required B intensity for C amount of time. Furthermore, the level of annealing performed on the Josephson junction 104 can be monitored by monitoring the normal state electrical resistance of the Josephson junction 104 (e.g., based on the Ambegaokar-Baratoff formula relating critical current to normal state resistance). Those of skill in the art will appreciate that such monitoring can be implemented by systems and methods known in the art (e.g., via an Ohmmeter, and so on).

As explained, FIG. 2 depicts a circuit diagram 200 that illustrates the electrical response of the capacitor pads 106 and the Josephson junction 104 to the reception of the electromagnetic signal/wave 112. As mentioned above, although the drawings depict the set of one or more capacitor pads 106 in a transmon configuration (e.g., pads of a capacitor, which is coupled in parallel to the Josephson junction 104), the systems and/or methods described herein can be implemented with various other electrical components coupled to the Josephson junction 104 in lieu of the capacitor pads 106 (e.g., any component that can receive the electromagnetic signal/wave 112 to generate an alternating current 206 and/or alternating voltage 208 can suffice). Those of skill in the art will appreciate that different but analogous circuit diagrams can be created to describe the electrical properties of such embodiments.

Figure 3:
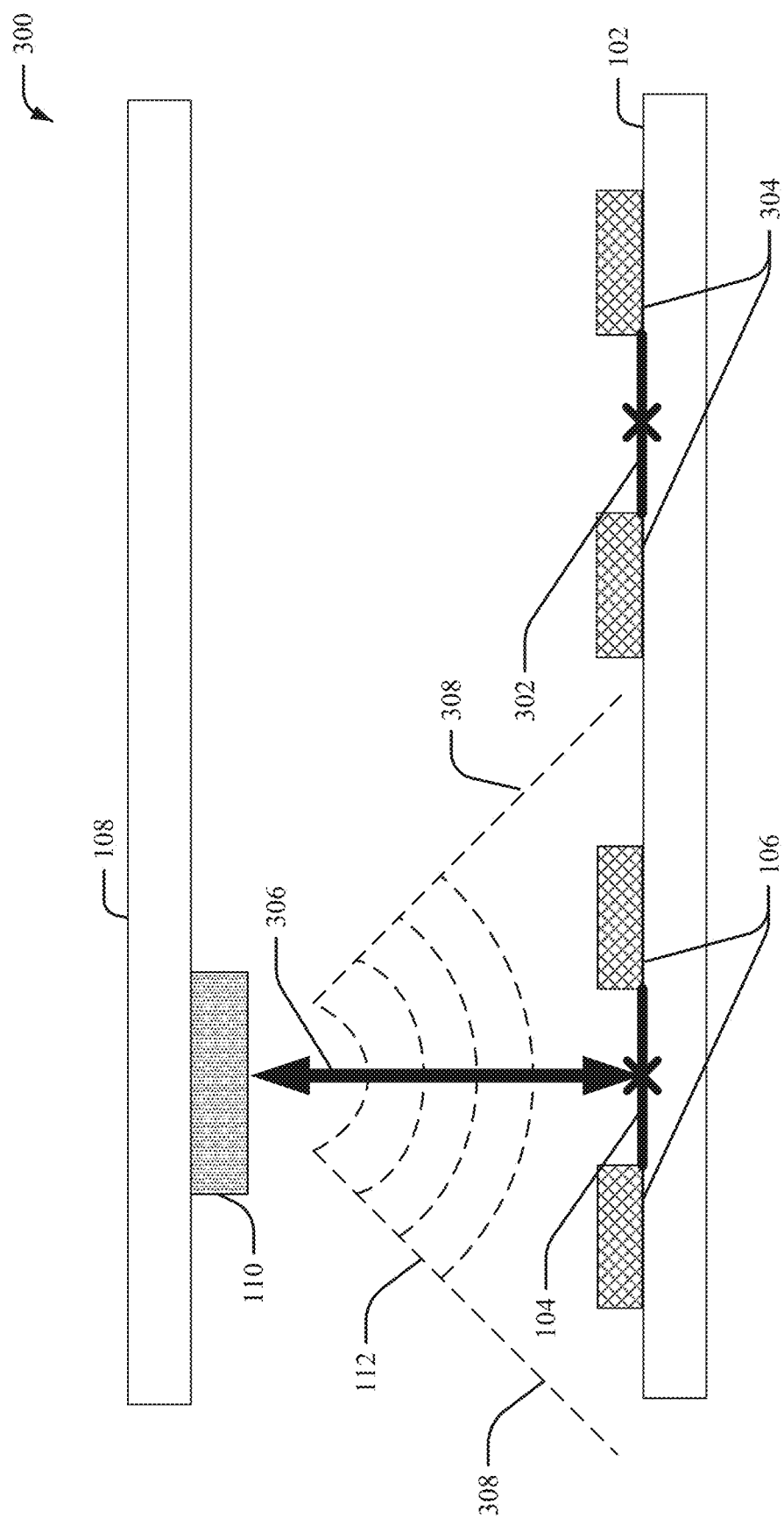
FIG. 3 illustrates a side-view schematic of an example, non-limiting system that facilitates antenna-based qubit annealing with a defined vertical gap in accordance with one or more embodiments described herein.

Now, consider FIG. 3. FIG. 3 illustrates a side-view schematic of an example, non-limiting system that facilitates antenna-based qubit annealing with a defined vertical gap in accordance with one or more embodiments described herein. As shown, the system 300 can comprise the superconducting qubit chip 102, the Josephson junction 104 having the set of one or more capacitor pads 106, the emitter/semiconductor chip 108, and the RF emitter/antenna 110 that can be positioned above the superconducting qubit chip 102 and that can emit/direct the electromagnetic signal/wave 112 toward the Josephson junction 104.

As shown, the superconducting qubit chip 102 can further have a second qubit with a second Josephson junction 302 with a second set of one or more capacitor pads 304. Additionally, the system 300 can include a defined vertical gap 306 between the RF emitter/antenna 110 and the superconducting qubit chip 102. In various embodiments, a length of the defined vertical gap 306 (e.g., a height of the gap 306 separating the antenna 110 and/or the antenna chip 108 from the superconducting qubit chip 102) can be sized to cause the electromagnetic signal/wave 112 to circumscribe the set of one or more capacitor pads 106 of the Josephson junction 104. This can cause annealing of the Josephson junction 104, substantially as described above.

In other words, the distance separating the RF emitter/antenna 110 from the superconducting qubit chip 102 (e.g., the height/length of the defined vertical gap 306) can be controlled/modulated (e.g., by robotic arms, micromanipulators, piezocontrollers, spacers and other temporary attachments, and so on) such that it is appropriately sized (e.g., not too tall and/or not too short) to facilitate localized annealing of the Josephson junction 104 without causing unwanted annealing of the second Josephson junction 302. In one or more embodiments, controlling/modulating the length/height of the defined vertical gap 306 can change the amount of surface area of the superconducting qubit chip 102 that is circumscribed/enveloped by the electromagnetic signal/wave 112. That is, the amount of surface area of the superconducting qubit chip 102 that is within the propagation path of the electromagnetic signal/wave 112 (e.g., where the propagation path of signal/wave 112 is denoted by guidelines 308) can be changed/controlled. For example, the height/length of the defined vertical gap 306 shown in FIG. 3 can cause the electromagnetic signal/wave 112 to circumscribe the capacitor pads 106 (e.g., the pads 106 are within the guidelines 308, and are thus within the propagation path of the signal/wave 112) and to not circumscribe the capacitor pads 304 (e.g., the pads 304 are not within the guidelines 308, and so are not within the propagation path of the signal/wave 112). Thus, the pads 106 can receive the electromagnetic signal/wave 112, thereby annealing the Josephson junction 104, while the pads 304 cannot receive the electromagnetic signal/wave 112, thereby preventing annealing of the second Josephson junction 302.

In various embodiments, the height/length of the defined vertical gap 306 can be changed/controlled. For example, if the height/length of the defined vertical gap 306 were sufficiently larger than that shown in FIG. 3, parts of the second set of one or more capacitor pads 304 could then be placed within the propagation path of the electromagnetic signal/wave 112 (e.g., within the guidelines 308). In such case, at least some part of the pads 304 could receive the electromagnetic signal/wave 112, thereby annealing and/or otherwise affecting the second Josephson junction 302. That is, neighboring qubits/Josephson junctions can be mistakenly, accidentally, and/or unwantedly annealed/affected if the length/height of the defined vertical gap 306 is too large. As another example, if the height/length of the defined vertical gap 306 were sufficiently smaller than that shown in FIG. 3, parts of the first set of one or more capacitor pads 106 could then be placed outside the propagation path of the electromagnetic signal/wave 112 (e.g., outside the guidelines 308). In such case, at least some part of the pads 106 could not receive the electromagnetic signal/wave 112, thereby resulting in suboptimal annealing (or potentially no annealing) of the Josephson junction 104. That is, insufficient/sub-optimal annealing of a target qubit/Josephson junction can occur if the length/height of the defined vertical gap 306 is too small.

As mentioned above, an advantage of these various embodiments is the facilitation of precise, accurate, and reliable localized annealing of at least one target qubit on a multi-qubit chip without unwantedly annealing neighboring qubits on the multi-qubit chip. More specifically, appropriately sizing the height/length of the defined vertical gap 306 can solve the problem of imprecise, inaccurate, and/or accidental annealing of neighboring qubits.

Although FIG. 3 depicts the RF emitter/antenna 110 as directly and/or substantially directly vertically above the Josephson junction 104, those of skill in the art will appreciate that the RF emitter/antenna 110 does not need to be positioned as such, and that other positions/configurations of the RF emitter/antenna 110 can be incorporated. Furthermore, even though FIG. 3 depicts only two Josephson junctions (e.g., a target junction 104 to be annealed and a neighboring junction 302 to not be annealed), those of skill in the art will understand that any number of target qubits/Josephson junctions 104 and/or any number of neighboring qubits/Josephson junctions 302 can be incorporated onto the superconducting qubit chip 102. Similarly, although FIG. 3 shows only one RF emitter/antenna 110 on the emitter/semiconductor chip 108, those of ordinary skill will appreciate that any number of emitters/antennas 110 can be incorporated.

Figure 4:
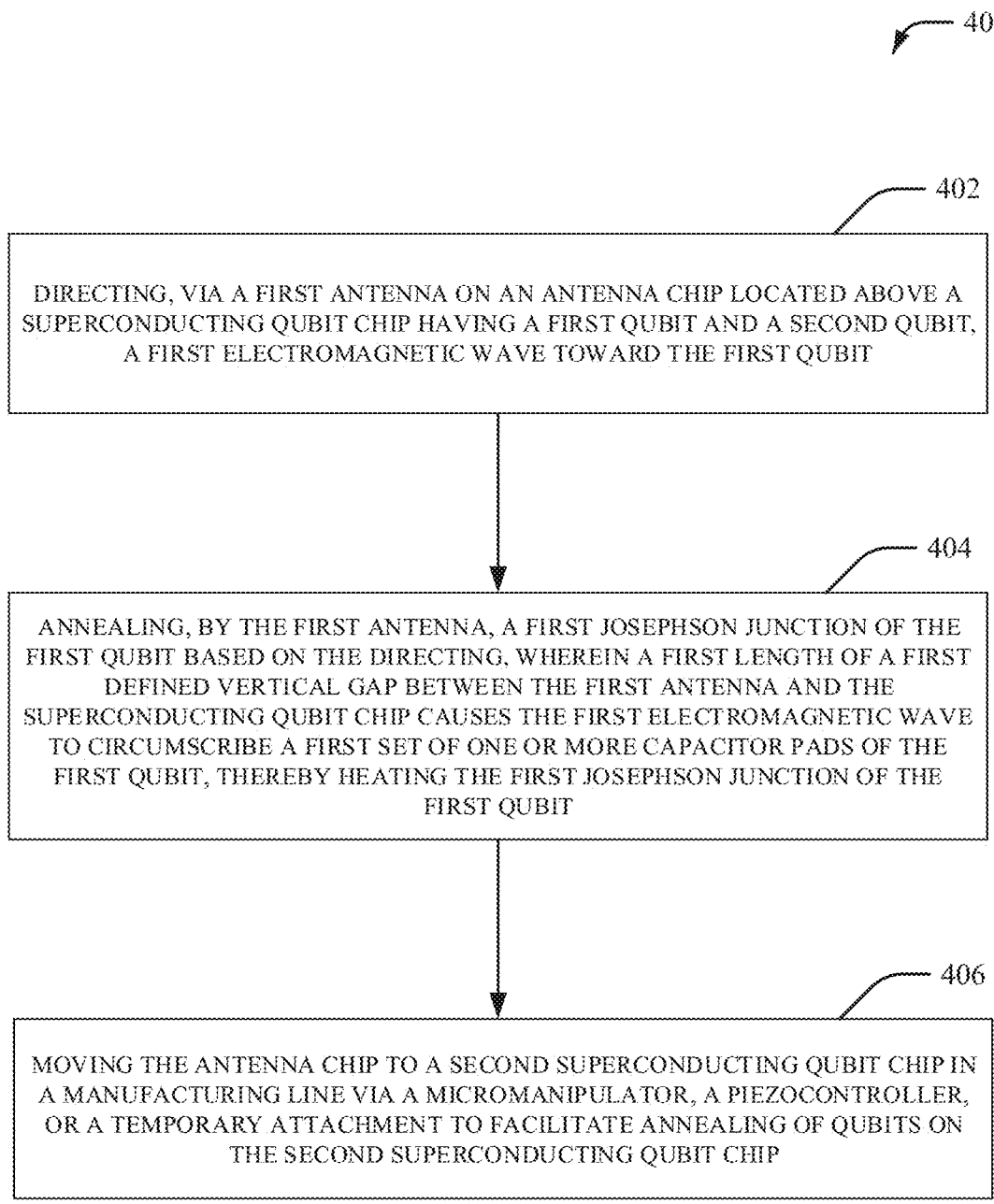
FIG. 4 illustrates a flow diagram of an example, non-limiting computer-implemented method that facilitates antenna-based qubit annealing with a defined vertical gap in accordance with one or more embodiments described herein.

Now, consider FIG. 4. FIG. 4 illustrates a flow diagram of an example, non-limiting computer-implemented method that facilitates antenna-based qubit annealing with a defined vertical gap in accordance with one or more embodiments described herein. That is, FIG. 4 depicts a computer-implemented method 400 that can be facilitated by the system 300 of FIG. 3.

At step 402, a first antenna, on an antenna chip located above a superconducting qubit chip having a first qubit and a second qubit, can direct a first electromagnetic wave toward the first qubit. At 404, the first antenna can then anneal a first Josephson junction of the first qubit based on the directing, substantially as described above. Furthermore, a first length of a first defined vertical gap between the first antenna (and/or the antenna chip) and the superconducting qubit chip can cause the first electromagnetic wave to circumscribe a first set of one or more capacitor pads of the first qubit. This can thereby heat the first Josephson junction of the first qubit. Moreover, as explained above in connection with FIG. 3, the first length of the first defined vertical gap can prevent the first electromagnetic wave from circumscribing a second set of one or more capacitor pads of the second qubit, thereby preventing annealing of a second Josephson junction of the second qubit. Again, an advantage of these one or more embodiments is to facilitate reliable and repeatable localized annealing of at least one target qubit on a multi-qubit chip without accidentally affecting neighboring qubits on the multi-qubit chip. Moreover, at 406, a micromanipulator, a piezocontroller, or a temporary attachment (e.g., spacers, mechanical clamps, and devices that can temporarily attach the antenna chip above the superconducting qubit chip) can move the antenna chip to a second superconducting qubit chip (e.g., such that the antenna chip is above the second superconducting qubit chip). This can facilitate annealing of qubits on the second superconducting qubit chip, substantially as described above. An advantage of these one or more embodiments is to facilitate consistent and reliable qubit annealing across multiple qubit chips queued for annealing (e.g., such as in a qubit or Josephson junction manufacturing line).

Figure 5:
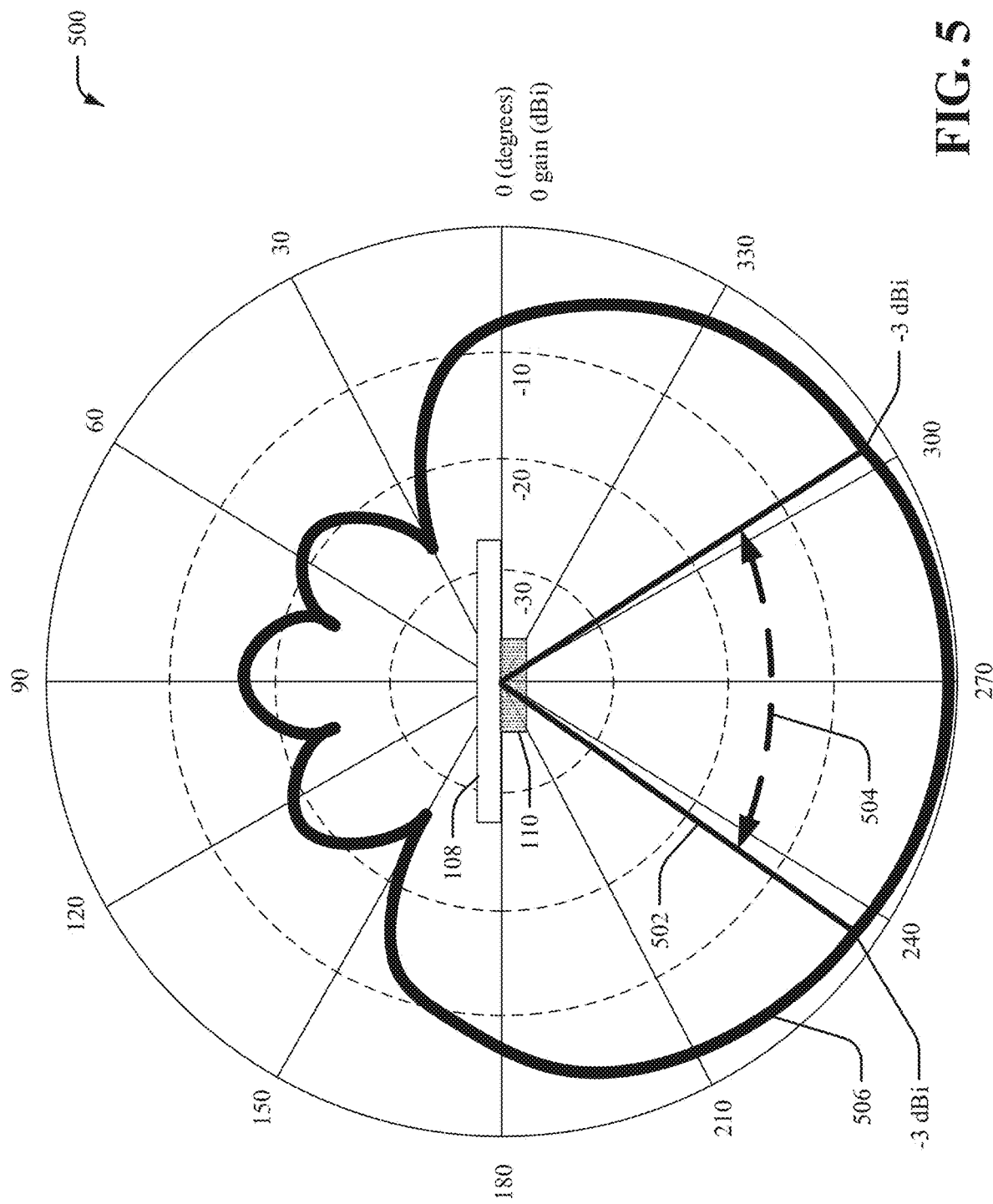
FIG. 5 illustrates a radiation pattern graph of an example, non-limiting system that facilitates antenna-based qubit annealing in accordance with one or more embodiments described herein.
Figure 6C:
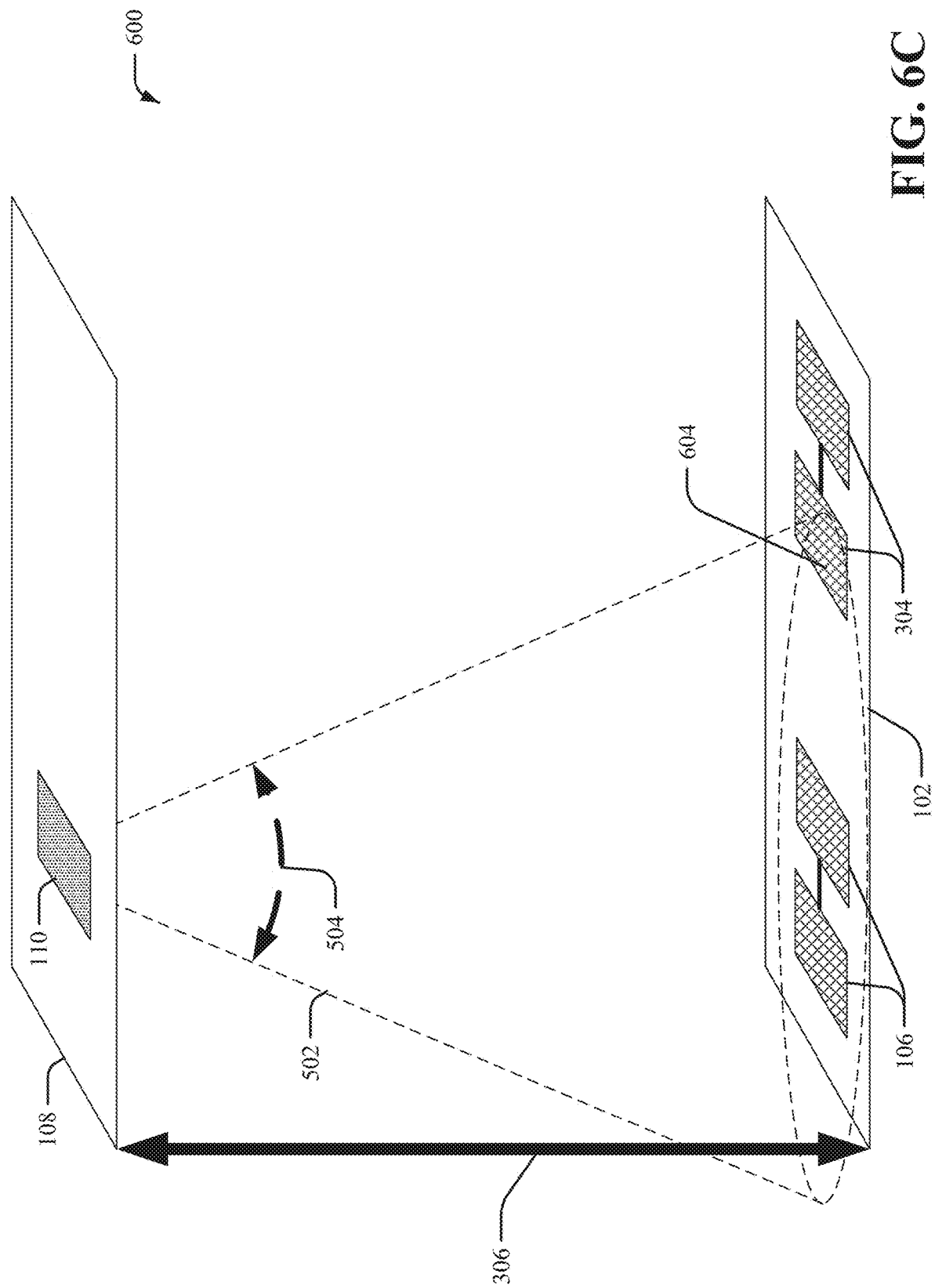

Now, to understand more fully how to appropriately size the defined vertical gap 306, consider FIGS. 5-6C. FIG. 5 illustrates a radiation pattern graph of an example, non-limiting system that facilitates antenna-based qubit annealing in accordance with one or more embodiments described herein. In other words, FIG. 5 shows a graph 500 of the directional dependence of the strength of a signal/wave emitted and/or directed by the RF emitter/antenna 110.

As shown, the graph 500 depicts the RF emitter/antenna 110 on the emitter/semiconductor chip 108 and a corresponding radiation pattern 506 generated by the emitter/antenna 110. The radiation pattern 506 represents the forward gain (e.g., strength) of an electromagnetic signal/wave (e.g., electromagnetic signal/wave 112) emitted by the RF emitter/antenna 110 as a function of direction (e.g., angle $\theta$) in units of decibel isotropic (dBi). That is, the graph 500 represents the gain of the antenna 110 relative to a hypothetical isotropic antenna that can radiate waves equally in all directions. As shown, FIG. 5 depicts two axes of measurement: direction and gain. The direction is represented in angular degrees (e.g., angle $\theta$), measured counter-clockwise from the rightmost horizontal (e.g., $\theta=0°$). The gain is measured in decibel isotropic units (e.g., dBi) as a sequence of concentric circles centered about the RF emitter/antenna 110 (e.g., beginning at 0 dBi on the outer-most periphery of the graph 500, then progressing to −10 dBi, then to −20 dBi, and then to −30 dBi, and so on as the concentric circles get closer to the RF emitter/antenna 110). As those of skill in the art will understand, a more negative forward gain in a particular direction represents a weaker signal in that direction, whereas a more positive forward gain in a particular direction represents a stronger signal in that direction.

Now, the radiation pattern 506 is illustrative only and is not to be interpreted as experimentally collected data or as referential data useful for industry applications. Instead, the radiation pattern 506 is exemplary and conceptual only.

As shown, the radiation pattern 506 can be strongest (e.g., less negative, and more positive) in a bottom two-thirds portion of the graph 500 (e.g., from approximately $\theta=150°$ to approximately $\theta=30°$, representing an angular span of about 240°). Thus, that section of the radiation pattern 500 can represent a main lobe of the electromagnetic signal/wave 112 emitted by the RF emitter/antenna 110. As also shown, the radiation pattern 500 can be weakest in a top one-third portion of the graph 500 (e.g., from approximately $\theta=30°$ to approximately $\theta=150°$, representing an angular span of about 120°). Indeed, this portion of the radiation pattern 506 can contain one or more back/side lobes (e.g., three back/side lobes depicted in FIG. 5). As those of skill in the art will appreciate, radiation patterns can vary by antenna, and so any other different and/or modified radiation pattern can be incorporated into various embodiments of the present invention depending on the RF emitter/antenna 110 (e.g., embodiments with more and/or fewer lobes, embodiments with different gain values, and so on).

Now, the height/length of the defined vertical gap 306 can be a function of a model of the electromagnetic signal/wave 112 as a cone. In other words, the main lobe of the radiation pattern 506 can be modeled/represented/approximated as a cone extending downward from the RF emitter/antenna 110. To illustrate this, graph 500 can show a projection of a cone 502 with an angular beam width 504. That is, the beam width 504 can represent the angular span of the apex angle of the cone 502. In one or more embodiments, the beam width 504 can represent a three-decibel angular beam width of the main lobe of the electromagnetic signal/wave 112 (e.g., of the main lobe of the radiation pattern 506). As those of ordinary skill will understand, a three-decibel angular beam width, represented by points having a forward gain of −3 dBi, can correspond to the half-power points of the radiation pattern 506 (e.g., the points at which the strength of the radiation pattern 506 is approximately half the strength of an isotropic radiation pattern). As illustrated in FIG. 5, the three-decibel angular beam width (e.g., beam width 504) can, in one or more embodiments, be approximately 60 degrees (but other values are possible depending on the emitter 110). Although FIG. 5 depicts the angular beam width 504 as corresponding to a three-decibel angular beam width of the main lobe of the radiation pattern 506, those of ordinary skill in the art will appreciate that other values of the angular beam width 504 can be incorporated.

Thus, by examining a radiation pattern graph (e.g., such as graph 500) of the RF emitter/antenna 110, an apex angle (e.g., angular beam width 504) of a cone (e.g., cone 502), which can mathematically approximate a main lobe of the radiation pattern, can be obtained/learned. This angular beam width 504 can then be used in basic geometric calculations to determine an appropriate height/length of the defined vertical gap 306, as explained below.

Now, consider FIGS. 6A-6C. FIGS. 6A-6C illustrate perspective schematics of an example, non-limiting system that facilitates localized antenna-based qubit annealing with a defined vertical gap in accordance with one or more embodiments described herein. That is, FIGS. 6A-6C depict perspective/isometric views of the system 300, and can additionally show a three-dimensional perspective of the cone 502 having an apex angle approximately equal to the angular beam width 504.

As shown, the cone 502 can originate from the RF emitter/antenna 110 and can extend toward the superconducting qubit chip 102. That is, the cone 502 can represent/approximate the main lobe of the radiation pattern 506 of the electromagnetic signal/wave 112. Now, in various embodiments, this model (e.g., system 600) can be used to determine an appropriate height/length of the defined vertical gap 306. For instance, the length/height of the defined vertical gap 306 can be approximately equal to a height of the cone 502. Moreover, in one or more embodiments, a base of the cone 502 can circumscribe the set of one or more capacitor pads 106, and can avoid circumscribing the second set of one or more capacitor pads 304. As mentioned above, this can facilitate annealing of the Josephson junction 104 without unwantedly annealing the second Josephson junction 302. Further still, in various embodiments, an apex angle of the cone 502 can be approximately equal to a three-decibel angular beam width (e.g., beam width 504) of a main lobe of the radiation pattern of the electromagnetic signal/wave 112, as described above.

So, the angular beam width 504 can be learned/known from examining a radiation pattern graph, such as the graph 500. Moreover, assuming the dimensions of the set of one or more capacitor pads 106 are known, the radius of the base of the cone 502 can be learned (e.g., the diameter of the base of the cone 502 can be large enough for the base to circumscribe the set of pads 106 and/or small enough to avoid circumscribing the set of pads 304). Thus, the height of the cone 502 can be obtained using trigonometry. Specifically, the height of the cone 502 (and thus the height/length of the defined vertical gap 306) can be approximately equal to the quotient yielded by dividing the radius of the base of the cone 502 by the tangent of half the angular beam width 504 (e.g., height=radius/(tan((beam width)/2)). Those of skill in the art will appreciate that other ways of approximating the height/length of the defined vertical gap 306 can be incorporated.

FIGS. 6B and 6C show perspective views of the system 600 having a significantly shorter and/or longer height/length of the defined vertical gap 306, respectively. As shown in FIG. 6B, if the height/length of the defined vertical gap 306 is sufficiently smaller than that shown in FIG. 6A, the cone 502 can fail to circumscribe the entirety of the set of one or more capacitor pads 106 (e.g., at least some part of the pads 106 cannot be covered by the base of the cone 502). For instance, portion 602 of the set of one or more capacitor pads 106 can fail to be circumscribed by the cone 502. Thus, in such case, at least some part of the pads 106 (e.g., portion 602) cannot receive the electromagnetic signal/wave 112. As mentioned above, this can result in suboptimal annealing of the Josephson junction 104 since the pads 106 cannot be fully/appropriately excited by the electromagnetic signal/wave 112. Similarly, as shown in FIG. 6C, if the height/length of the defined vertical gap 306 is sufficiently larger than that shown in FIG. 6A, the cone 502 can circumscribe at least some part of the second set of one or more capacitor pads 304 (e.g., portion 604 of the second set of pads 304). Thus, in such case, at least some part of the pads 304 (e.g., portion 604) can receive the electromagnetic signal/wave 112. As mentioned above, this can result in unwanted, accidental, and/or mistaken annealing (and/or other alteration) of the second Josephson junction 302 since the pads 304 can be partially excited by the electromagnetic signal/wave 112.

Again, by examining a radiation pattern graph (e.g., graph 500) to obtain a suitable apex angle of the cone 502 (e.g., beam width 504), and by modulating the area of the base of the cone 502, an appropriate height/length of the defined vertical gap 306 can be obtained via basic trigonometry. Thus, the problem of appropriately positioning an antenna so as to facilitate consistent and reliable localized antenna-based annealing of qubits on a multi-qubit chip can be solved.

Those of skill in the art will appreciate that FIGS. 6A-6C (as well as other figures herein) are not drawn to scale.

Figure 7:
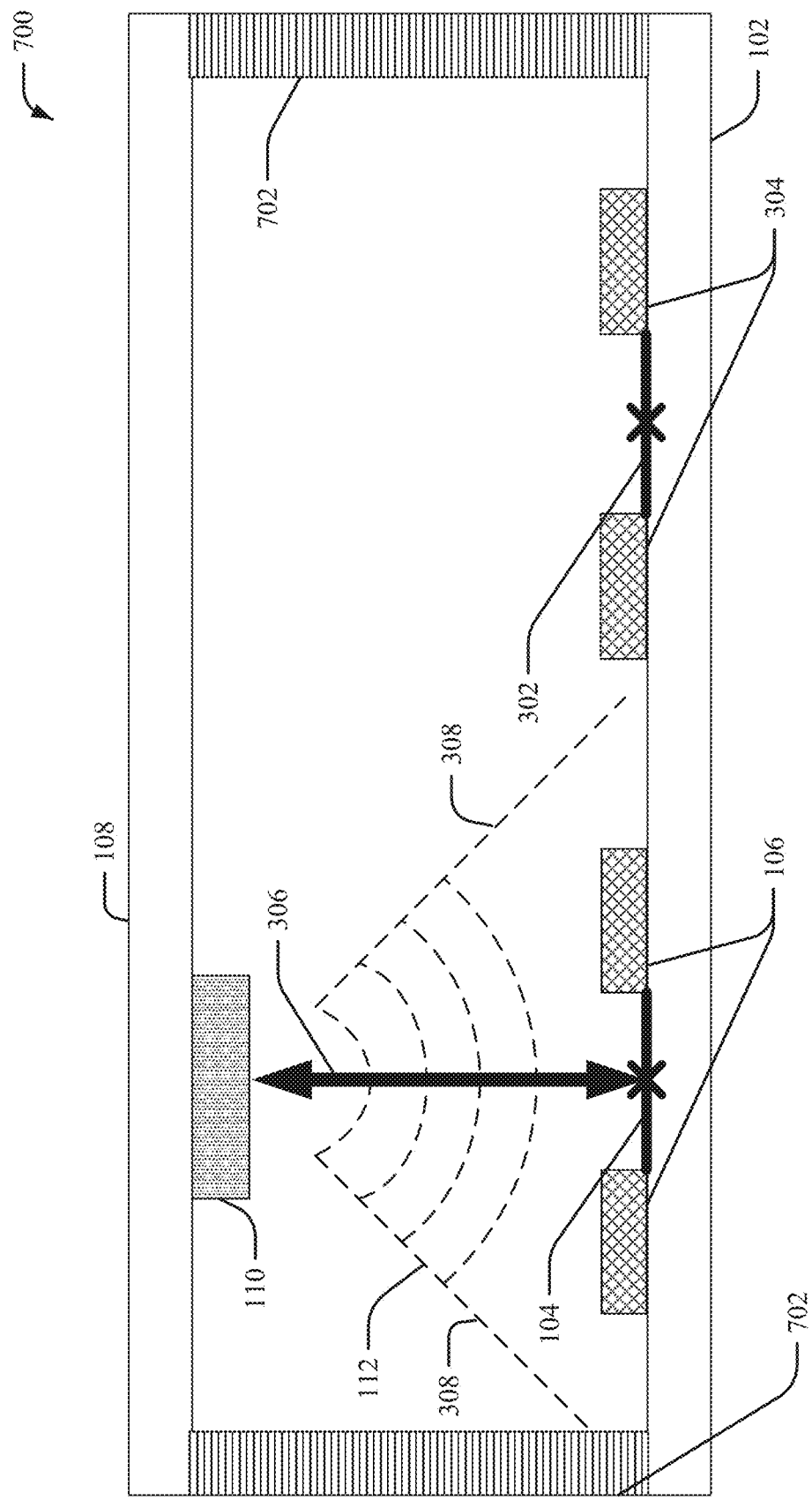
FIG. 7 illustrates a side-view schematic of an example, non-limiting system that facilitates localizing antenna-based qubit annealing using spacers in accordance with one or more embodiments described herein.

Now, consider FIG. 7. FIG. 7 illustrates a side-view schematic of an example, non-limiting system that facilitates localizing antenna-based qubit annealing using spacers in accordance with one or more embodiments described herein. As shown, the system 700 can comprise the superconducting qubit chip 102, the first Josephson junction 104 with the set of one or more capacitor pads 106, the second Josephson junction 302 with the second set of one or more capacitor pads 304, the emitter/semiconductor chip 108, and the RF emitter/antenna 110 that can direct the electromagnetic signal/wave 112.

Additionally, the system 700 can comprise one or more spacers 702. The one or more spacers 702 can be located in the defined vertical gap 306 between the RF emitter/antenna 110 (or the antenna chip 108) and the superconducting qubit chip 102. Additionally, a height of the one or more spacers 702 can be approximately equal to the length/height of the defined vertical gap 306. That is, the one or more spacers 702 can be placed in between the emitter/semiconductor chip 108 and the superconducting qubit chip 102 (and/or otherwise between the RF emitter/antenna 110 and the superconducting qubit chip 102) so as to separate the RF emitter/antenna 110 and the superconducting qubit chip 102 by enough space to facilitate localized annealing of the Josephson junction 104, substantially as described above. So, the one or more spacers 702 can be sized such that they cause the defined vertical gap 306 to be at a particular height, which causes the electromagnetic signal/wave 112 to circumscribe/envelope the set of one or more capacitor pads 106 (e.g., pads 106 are within the guidelines 308), and to not circumscribe/envelope the second set of one or more capacitor pads 304 (e.g., the pads 304 are not within the guidelines 308). As discussed above, this can cause annealing of the Josephson junction 104 without annealing the second Josephson junction 302. Those of skill will appreciate that other means of temporary attachment (e.g., mechanical clamps, spacing blocks, and so on) can be incorporated to separate the antenna chip 108 from the superconducting qubit chip 102 to appropriately size the defined vertical gap 306.

Moreover, those of skill in the art will appreciate that the height of the one or more spacers 702 does not need to be exactly equal to the height of the defined vertical gap 306. Indeed, as can be seen in FIG. 7, the height of the one or more spacers 702 can, in various embodiments, be equal to the sum of the height/length of the defined vertical gap 306 and the vertical height/thickness of the RF emitter/antenna 110. However, in one or more embodiments, the RF emitter/antenna 110 can be substantially shorter (e.g., as thin as 0.035 millimeters for some patch antennas) than the one or more spacers 702. Thus, those of skill in the art will appreciate that the height of the one or more spacers 702 can, in various embodiments, still be said to be approximately equal to the height of the defined vertical gap 306.

Those of ordinary skill will understand that the one or more spacers 702 can be made of any suitable material known in the art that can reliably separate the antenna 110 from the superconducting qubit chip 102 without negatively affecting the annealing of the target junctions (e.g., insulators, plastics, wood, metal, ceramics, and so on).

Figure 8:
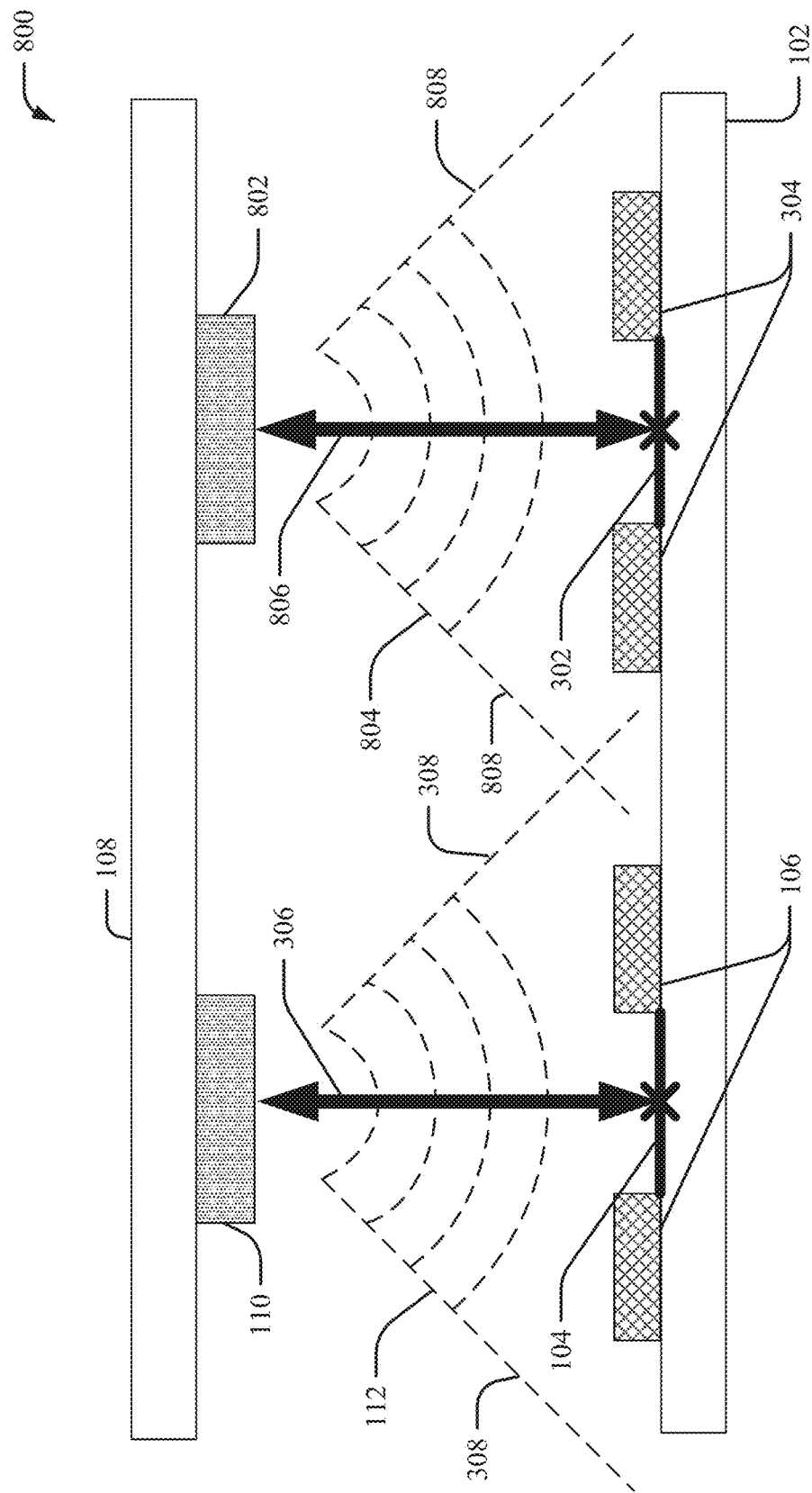
FIG. 8 illustrates a side-view schematic of an example, non-limiting system that facilitates antenna-based qubit annealing of multiple qubits in accordance with one or more embodiments described herein.

Now, consider FIG. 8. FIG. 8 illustrates a side-view schematic of an example, non-limiting system that facilitates antenna-based qubit annealing of multiple qubits in accordance with one or more embodiments described herein. As shown, the system 800 can comprise the superconducting qubit chip 102, the Josephson junction 104 having the set of one or more capacitor pads 106, the second Josephson junction 302 having the second set of one or more capacitor pads 304, the emitter/semiconductor chip 108, and the RF emitter/antenna 110 that can direct the electromagnetic signal/wave 112.

Additionally, the system 800 can comprise a second RF emitter/antenna 802 on the emitter chip 108. In various embodiments, the second RF emitter/antenna 802 can direct a second electromagnetic signal/wave 804 toward the second Josephson junction 302 (e.g., toward the second qubit). Moreover, the system 800 can also include a second defined vertical gap 806 between the second RF emitter/antenna 802 (or the emitter chip 108) and the superconducting qubit chip 102. A second length of the second defined vertical gap 806 can be sized to cause the second electromagnetic signal/wave 804 to circumscribe the second set of one or more capacitor pads 304 (e.g., the pads 304 are within the guidelines 808) of the second qubit, thereby annealing the second Josephson junction 302 of the second qubit. As explained above, this can cause the electromagnetic signal/wave 804 to not circumscribe the set of one or more capacitor pads 106 (e.g., the pads 106 are not within the guidelines 808).

Those of ordinary skill will understand that much of the discussion regarding the RF emitter/antenna 110, the electromagnetic signal/wave 112, and the defined vertical gap 306 can be applied to the second RF emitter/antenna 802, the second electromagnetic signal/wave 804, and the second defined vertical gap 806. Furthermore, those of skill will appreciate that the length/height of the second defined vertical gap 806 can be approximately equal to or unequal to, and can be determined in substantially the same way as, the length/height of the defined vertical gap 306. In some embodiments, one of the antennas 110 and 802 can be closer to and/or farther from the superconducting qubit chip 102 than the other so as to control/modulate the number of qubits/Josephson junctions annealed and/or not annealed by each antenna 110 and 802, substantially as described above. For example, the defined vertical gap 306 can be substantially shorter than the second defined vertical gap 806, such that the RF emitter/antenna 110 anneals only one and/or a few target qubits/Josephson junctions while the second RF emitter/antenna 802 anneals multiple and/or more qubits/Josephson junctions.

Moreover, in one or more embodiments, the RF emitter/antenna 110 can direct the electromagnetic signal/wave 112 for a first time period Likewise, the second RF emitter/antenna 802 can direct the second electromagnetic signal/wave 804 for a second time period. Additionally, the first time period and the second time period can be overlapping (e.g., the antennas 110 and 802 can anneal the Josephson junctions 104 and 302 simultaneously/concurrently). In other embodiments, the first time period and the second time period can be non-overlapping (e.g., serial annealing). Furthermore, in various embodiments, the first time period and the second time period can be of different lengths and/or of the same lengths (e.g., same and/or different durations of annealing). Those of ordinary skill will appreciate that the durations and/or timing of operation of the antennas 110 and 802 (e.g., durations and/or timing of annealing of the junctions 104 and 302) can be controlled based on context and/or circumstances of industry applications (e.g., parallel annealing if less processing time is available, and so on).

Similarly, each of the RF emitters/antennas 110 and 802 can be independently voltage and/or frequency tunable (e.g., so as to control the magnitude and/or frequency of the generated signals/waves 112 and 804). This tunability can be used to achieve defined and/or distinct levels of annealing of the Josephson junctions 104 and 302 (e.g., annealing one junction more and/or less than another). In the case of concurrent annealing of the Josephson junctions 104 and 302, FIG. 8 shows that the electromagnetic signal/wave 112 and the second electromagnetic signal/wave 804 can each be independently localized by their respective RF emitters/antennas, such that they can propagate through space/air and/or be received by their respective target qubits/capacitor pads without substantially interfering with each other. Since the magnitude and/or frequency of each wave 112 and 804 can be independently/individually controlled/tuned, each Josephson junction 104 and 302 can be independently annealed to achieve a defined/distinct level of annealing, and such annealing can occur simultaneously without the annealing of one junction substantially affecting the annealing of the other.

As mentioned above, an advantage of these various embodiments is to facilitate independent and concurrent localized annealing of multiple qubits on a multi-qubit chip, such that each target qubit can achieve a distinct level of annealing as compared to its neighboring qubits, and such that the annealing of each qubit does not necessarily affect the level of annealing of neighboring qubits.

Figure 9:
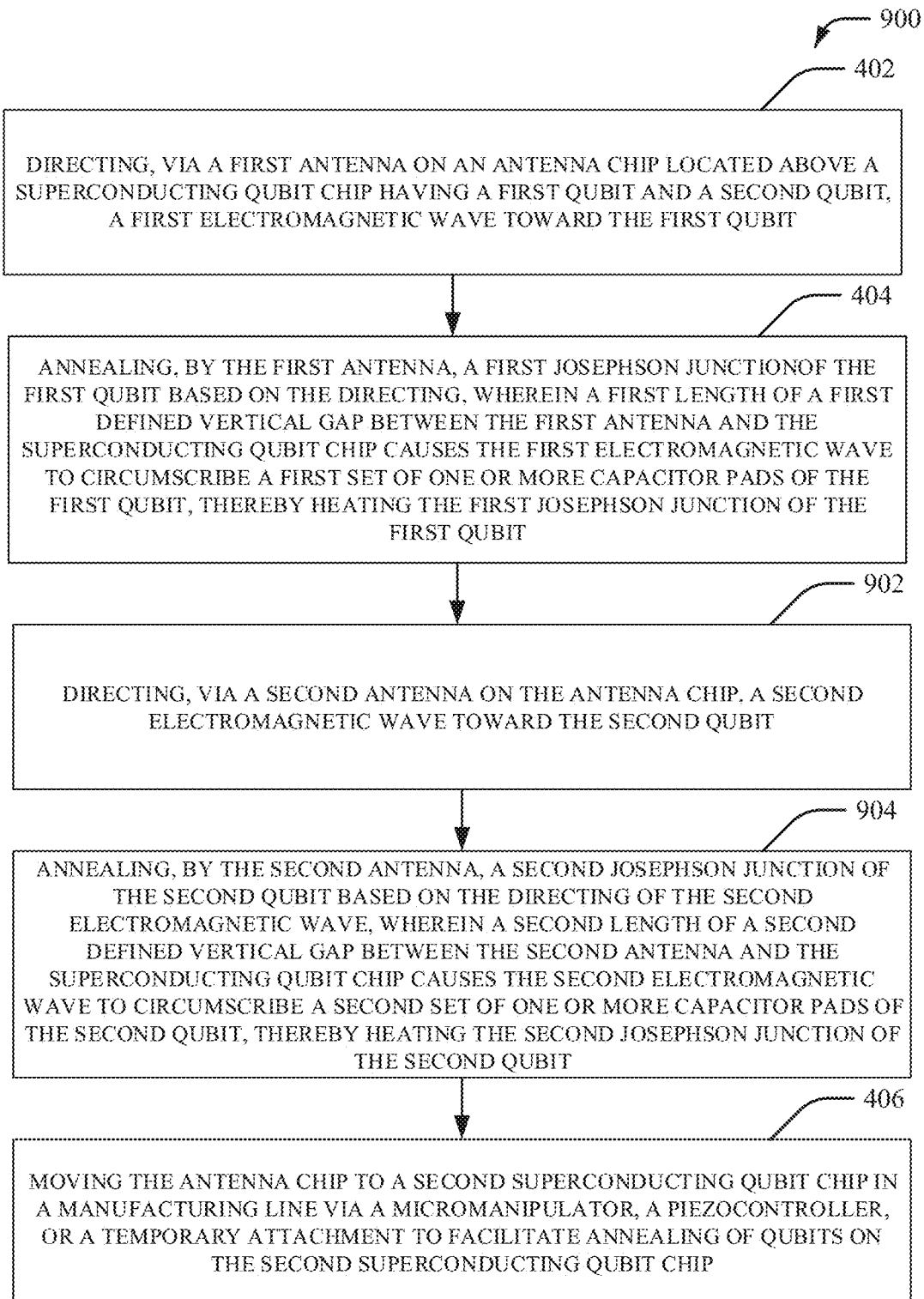
FIG. 9 illustrates a flow diagram of an example, non-limiting computer-implemented method that facilitates annealing multiple qubits by antenna-based qubit annealing in accordance with one or more embodiments described herein.

Now, consider FIG. 9. FIG. 9 illustrates a flow diagram of an example, non-limiting computer-implemented method that facilitates annealing multiple qubits by antenna-based qubit annealing in accordance with one or more embodiments described herein. That is, FIG. 9 depicts a computer-implemented method 900 that can comprise the computer-implemented method 400 and that can further include annealing a second Josephson junction.

At 402, a first antenna on an antenna chip located above a superconducting qubit chip having a first qubit and a second qubit can direct a first electromagnetic wave toward the first qubit. At 404, the first antenna can anneal a first Josephson junction of the first qubit based on the directing. Additionally, a first length of a first defined vertical gap between the first antenna and the superconducting qubit chip can cause the first electromagnetic wave to circumscribe a first set of one or more capacitor pads of the first qubit, thereby heating the first Josephson junction of the first qubit. As discussed above, this can cause the first electromagnetic wave to avoid circumscribing a second set of one or more capacitor pads of the second qubit, thereby not heating a second Josephson junction of the second qubit.

Now, at 902, a second antenna on the antenna chip can direct a second electromagnetic wave toward the second Josephson junction. At 904, the second antenna can anneal a second Josephson junction of the second qubit based on the directing of the second electromagnetic wave. Additionally, a second length of a second defined vertical gap between the second antenna and the superconducting qubit chip can cause the second electromagnetic wave to circumscribe the second set of one or more capacitor pads of the second qubit, thereby heating the second Josephson junction of the second qubit. As explained above, this can cause the second electromagnetic wave to not circumscribe the first set of one or more capacitor pads, thereby not heating the first Josephson junction of the first qubit. As discussed above, each antenna can be individually/independently voltage and/or frequency tunable. Thus, these one or more embodiments can advantageously facilitate independent and/or concurrent (or sequential) localized annealing of multiple qubits on a multi-qubit chip, such that the annealing of one qubit does not substantially affect the annealing of another. Lastly, at 406, a micromanipulator, a piezocontroller, or a temporary attachment can move the antenna chip to a second superconducting qubit chip to facilitate annealing of qubits on the second superconducting qubit chip, as described above.

Figure 10:
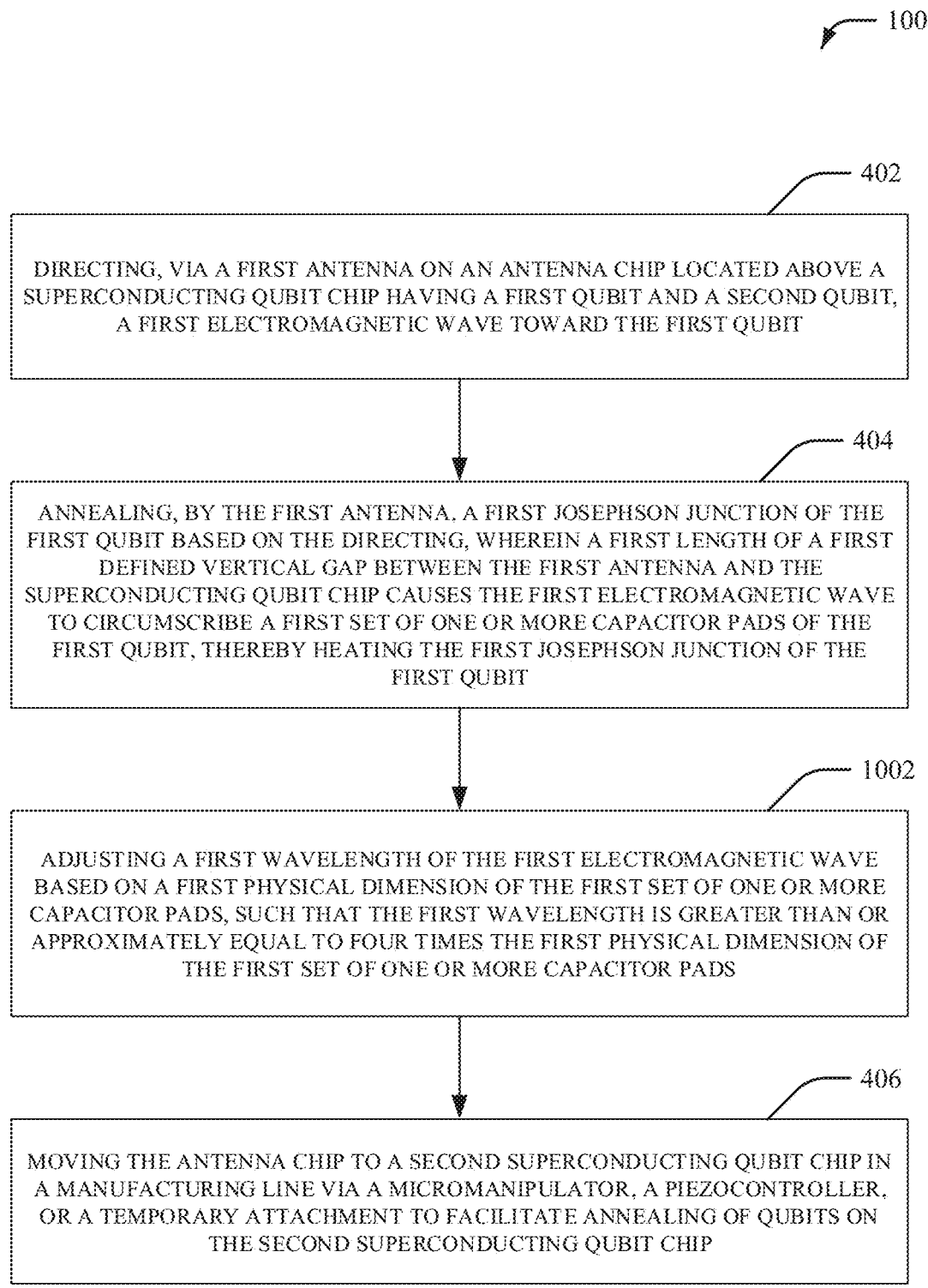
FIG. 10 illustrates a flow diagram of an example, non-limiting computer-implemented method that facilitates adjusting a wavelength of an emitted electromagnetic wave in accordance with one or more embodiments described herein.

Now, consider FIG. 10. FIG. 10 illustrates a flow diagram of an example, non-limiting computer-implemented method that facilitates adjusting a wavelength of an emitted electromagnetic wave in accordance with one or more embodiments described herein.

The first two steps can be as described above. At 402, a first antenna on an antenna chip located above a superconducting qubit chip having a first qubit and a second qubit can direct a first electromagnetic wave toward the first qubit. At 404, the first antenna can anneal a first Josephson junction of the first qubit based on the directing. Additionally, a first length of a first defined vertical gap between the first antenna and the superconducting qubit chip can cause the first electromagnetic wave to circumscribe a first set of one or more capacitor pads of the first qubit, thereby heating the first Josephson junction of the first qubit. As discussed above, this can cause the first electromagnetic wave to avoid circumscribing a second set of one or more capacitor pads of the second qubit, thereby not heating a second Josephson junction of the second qubit.

Now, at 1002, the first antenna can adjust a first wavelength of the first electromagnetic wave based on a first physical dimension of the first set of one or more capacitor pads. In some embodiments, the first wavelength can be greater than or approximately equal to four times the first physical dimension of the first set of one or more capacitor pads. For example, as described above, each pad of the first set of one or more capacitor pads can function as a receiving patch antenna. As those of ordinary skill will understand, patch antennas can efficiently receive/transmit signals/waves having wavelengths that are twice as long as their microstrip transmission lengths (e.g., the first physical dimension). In some embodiments, such antennas can efficiently receive/transmit signals/waves having wavelengths that are four times as long as their antenna lengths. An advantage of these embodiments is to control/tune the emitted/directed waves such that they can be reliably received by the capacitor pads.

Figure 11:
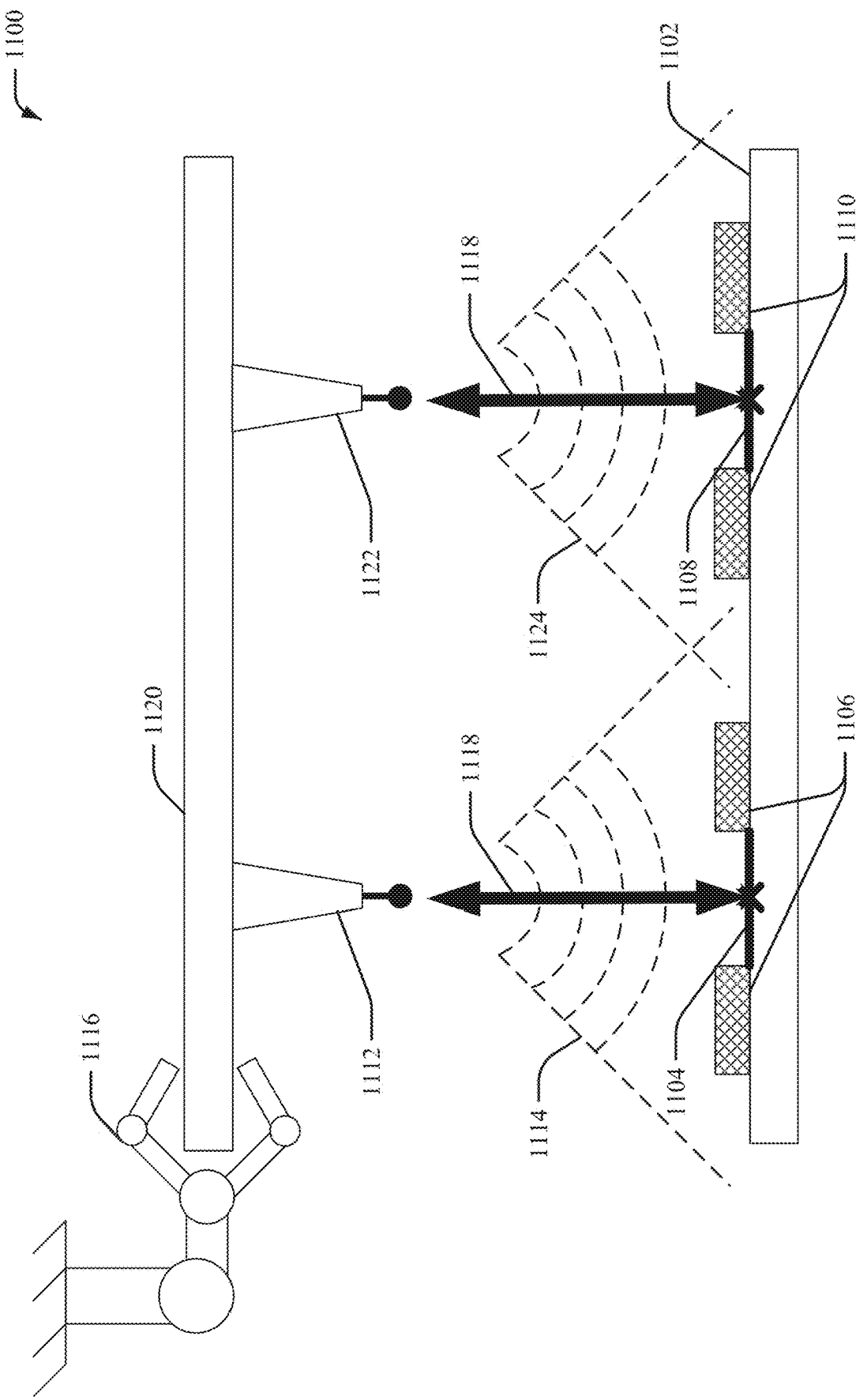
FIG. 11 illustrates a side-view schematic of an example, non-limiting system that facilitates antenna-based qubit annealing using a micromanipulator or piezocontroller in accordance with one or more embodiments described herein.

Now, consider FIG. 11. FIG. 11 illustrates a side-view schematic of an example, non-limiting system that facilitates antenna-based qubit annealing using a micromanipulator or piezocontroller in accordance with one or more embodiments described herein.

As shown, the system 1100 can comprise a superconducting qubit chip 1102 having a first Josephson junction 1104 (with a first set of one or more capacitor pads 1106) and a second Josephson junction 1108 (with a second set of one or more capacitor pads 1110). The system 1100 can also include an antenna chip 1120 above the superconducting qubit chip 1102. A first antenna 1112 can be on the antenna chip 1120 and can emit a first electromagnetic wave 1114 toward the first Josephson junction 1104. A second antenna 1122 can be on the antenna chip 1120 and can emit a second electromagnetic wave 1124 toward the second Josephson junction 1108. Additionally, the system 1100 can comprise a micromanipulator or piezocontroller 1116 (and/or micromanipulator or a temporary attachment as described above, not depicted in FIG. 11) that can position the antenna chip 1120 above the superconducting qubit chip 1102, with a defined vertical gap 1118 between the antenna chip 1120 (and/or the antennas 1112 and 1122) and the superconducting qubit chip 1102. Moreover, a length/height of the defined vertical gap 1118 can be sized by the micromanipulator or piezocontroller 1116 to cause the first electromagnetic wave 1114 to circumscribe the first Josephson junction 1104 (and to not circumscribe the second Josephson junction 1108), thereby annealing the first Josephson junction 1104 (and not annealing the second Josephson junction 1108). Furthermore, the length/height of the defined vertical gap can be sized to cause the second electromagnetic wave 1124 to circumscribe the second Josephson junction 1108 (and to not circumscribe the first Josephson junction 1104), thereby annealing the second Josephson junction 1108 (and not annealing the first Josephson junction 1104) Those of skill will understand that much of the discussion regarding FIG. 3 and FIG. 8 can apply to FIG. 11.

Now, the micromanipulator/piezocontroller 1116 can be a device (e.g., a robotic arm, a mechatronic claw, some other micro-electromechanical device, and so on) that can physically interact with and/or physically move, manipulate, position, and/or orient the antenna chip 1120. In some embodiments, the micromanipulator/piezocontroller 1116 can be capable of three-axis control (e.g., can position the antenna chip 1120 along the x-, y-, and/or z-axes in three-dimensional space). In other embodiments, the micromanipulator/piezocontroller 1116 can position the antenna chip 1120 in three-dimensional space via moving according to spherical coordinates (e.g., controlling azimuth, elevation, and radius). In still other embodiments, fewer degrees of freedom can be incorporated (e.g., only able to position the antenna chip 1120 in a vertical direction, so as to vary/control the height of the defined vertical gap 1118; or only able to move in a plane parallel to the superconducting qubit chip 1102; and so on). Because qubits and Josephson junctions can be extremely small (e.g., sub-micrometer dimensions, in some cases), physically positioning the antenna chip 1120 above the superconducting qubit chip 1102 can require a level of movement precision that is not feasibly achieved without highly accurate, electrically-controlled actuators. Incorporating the micromanipulator/piezocontroller 1116 can solve this problem, thereby enabling precise control over the position/orientation of the antenna chip 1120 above the superconducting qubit chip 1102. As those of ordinary skill will appreciate, any mechanical-electrical device known in the art that can physically interact with and/or manipulate the antenna chip 1120 can be incorporated (e.g., actuated pistons, servo motors, DC motors, piezoelectric actuators, pneumatic actuators, microelectromechanical actuators, and so on). Furthermore, a temporary attachment (e.g., spacers, mechanical clamps, and so on) can also be incorporated.

Although FIG. 11 depicts only a single micromanipulator/piezocontroller 1116 and two antennas 1112 and 1122, those of ordinary skill will appreciate that any number of micromanipulators and/or antennas can be incorporated in various embodiments.

In one or more embodiments, the length of the defined vertical gap 1118 can be approximately equal to a height of a cone, as described above. A base of the cone can circumscribe the first set of one or more capacitor pads 1106 (e.g., circumscribe the Josephson junction 1104), and an apex angle of the cone can be approximately equal to a three-decibel angular beam width of a main lobe of the radiation pattern of the first electromagnetic wave 1114, substantially as described above.

Figure 12:
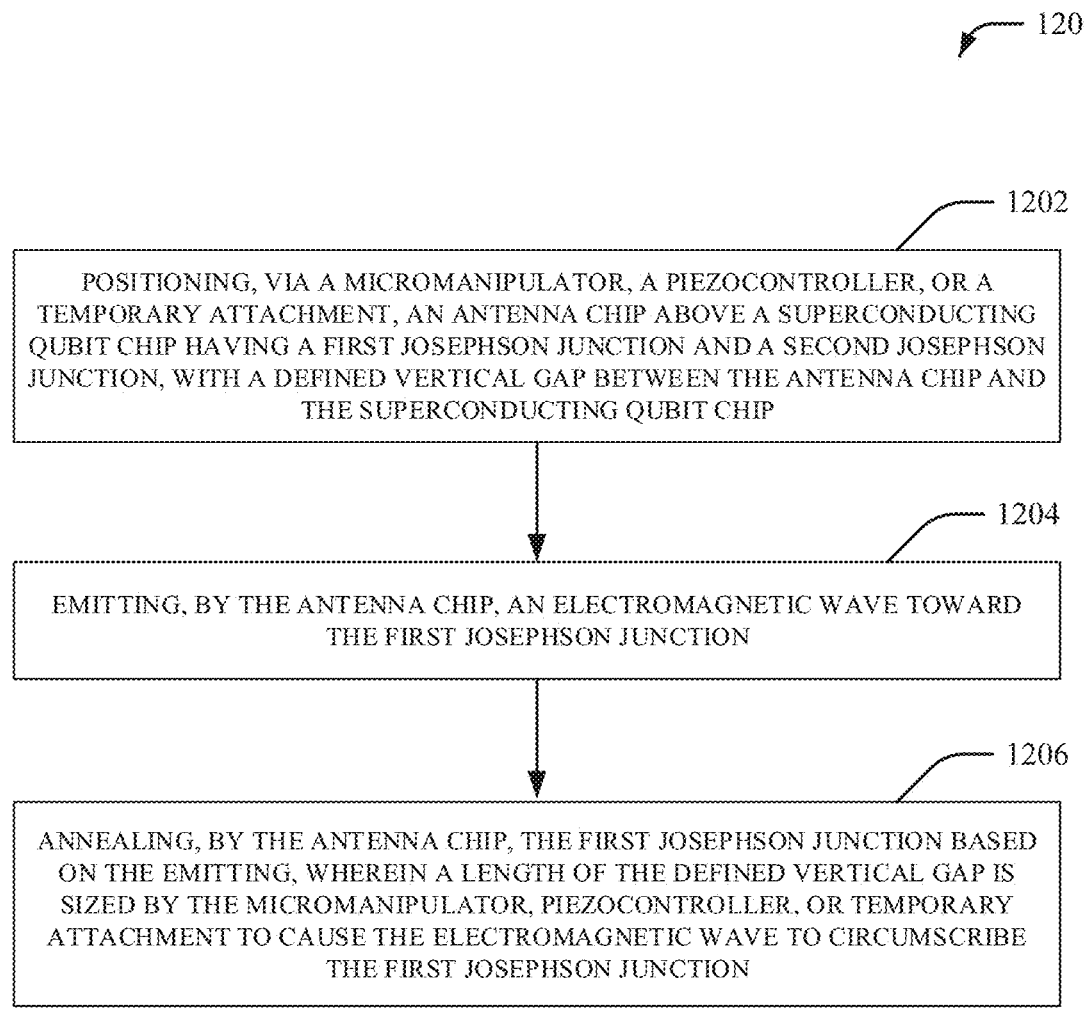
FIG. 12 illustrates a flow diagram of an example, non-limiting computer-implemented method that facilitates antenna-based qubit annealing using a micromanipulator or piezocontroller in accordance with one or more embodiments described herein.

Now, consider FIG. 12. FIG. 12 illustrates a flow diagram of an example, non-limiting computer-implemented method that facilitates antenna-based qubit annealing using a micromanipulator or piezocontroller in accordance with one or more embodiments described herein.

At 1202, a micromanipulator, a piezocontroller, or a temporary attachment can position an antenna chip above a superconducting qubit chip having a first Josephson junction and a second Josephson junction. Additionally, the micromanipulator, piezocontroller, or temporary attachment can create a defined vertical gap between the antenna chip and the superconducting qubit chip. At 1204, the antenna can emit an electromagnetic wave toward the first Josephson junction. At 1206, the antenna can anneal the first Josephson junction based on the emitting. Additionally, a length of the defined vertical gap can be sized by the micromanipulator, piezocontroller, or temporary attachment to cause the electromagnetic wave to circumscribe the first Josephson junction (e.g., and to avoid circumscribing the second Josephson junction), substantially as described above.

In various embodiments, as described above, the length of the defined vertical gap can be a function of a model of the radiation pattern of the electromagnetic wave as a cone. For example, the cone can originate from the antenna chip and can extend toward the superconducting qubit chip. In one or more embodiments, the length of the defined vertical gap can be approximately equal to a height of the cone. In such case, a base of the cone can circumscribe the first Josephson junction, and an apex angle of the cone can be approximately equal to a three-decibel angular beam width of a main lobe of a radiation pattern of the electromagnetic wave. Again, these one or more embodiments can solve the problem of positioning the antenna above the superconducting qubit chip so as to reliably and consistently perform localized and independent qubit annealing on multi-qubit chips.

Figure 13:
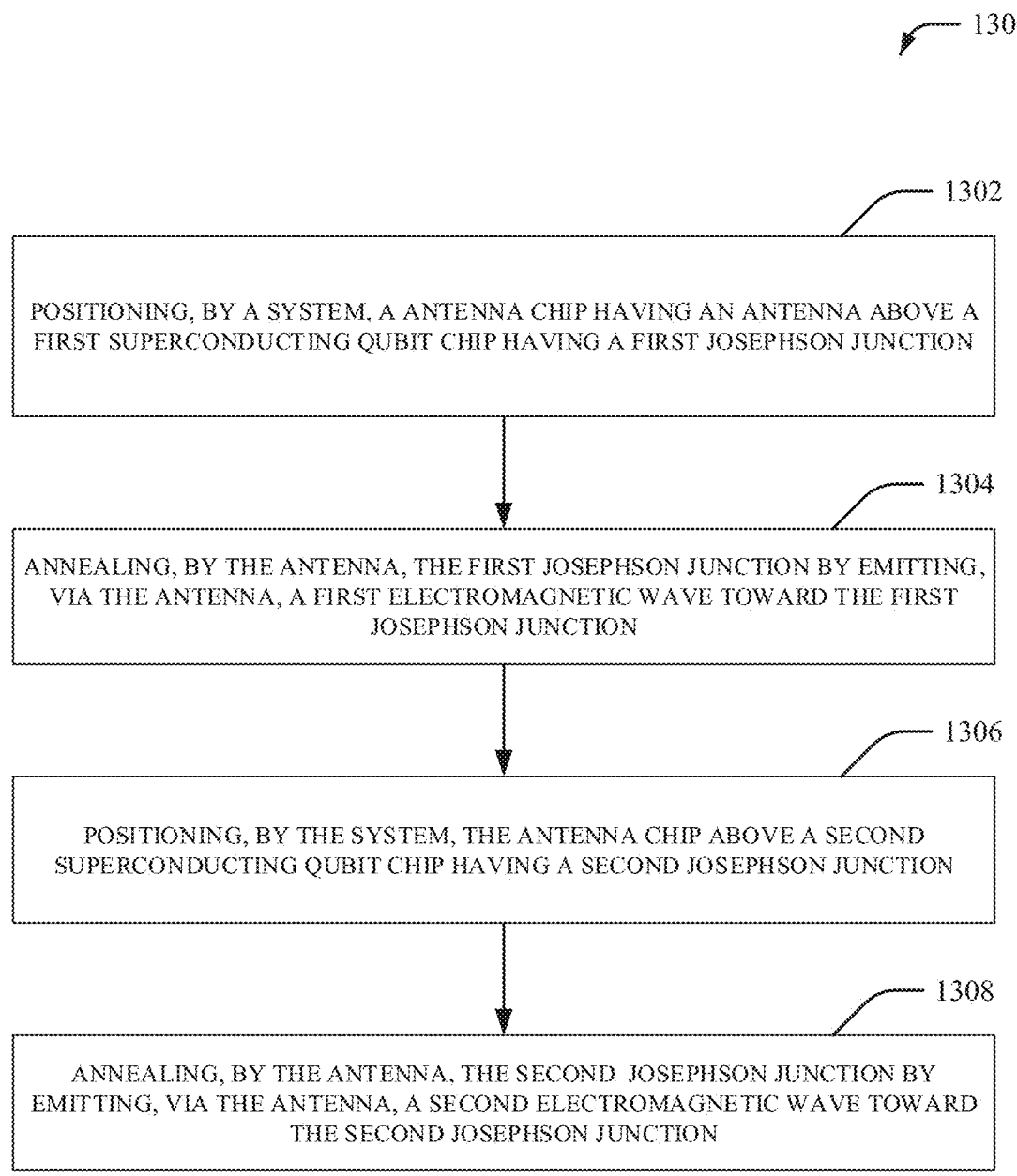
FIG. 13 illustrates a flow diagram of an example, non-limiting computer-implemented method that facilitates antenna-based qubit annealing by moving an antenna chip across multiple superconducting qubit chips queued for annealing in accordance with one or more embodiments described herein.

Now, consider FIG. 13. FIG. 13 illustrates a flow diagram of an example, non-limiting computer-implemented method that facilitates antenna-based qubit annealing by moving an antenna chip across multiple superconducting qubit chips queued for annealing in accordance with one or more embodiments described herein.

At 1302, a system can position an antenna chip having an antenna above a first superconducting qubit chip having a first Josephson junction. At 1304, the antenna can anneal the first Josephson junction by emitting a first electromagnetic wave toward the first Josephson junction. At 1306, the system can position the antenna chip above a second superconducting qubit chip having a second Josephson junction. At 1308, the antenna can anneal the second Josephson junction by emitting a second electromagnetic wave toward the second Josephson junction.

In other words, the computer-implemented method 1300 can facilitate moving an antenna chip (e.g., a semiconductor chip having emitters/antennas and that is in a dedicated qubit annealing fabrication process or manufacturing line) across multiple qubit chips that are desired/queued to be annealed. In some embodiments, the multiple superconducting qubit chips can be presented to the antenna chip via an assembly line and/or conveyor belt. In various other embodiments, the antenna chip can have multiple antennas that are positioned so as to correspond in a one-to-one fashion to multiple qubits on a particular type/design of superconducting qubit chip. In such case, a plurality of superconducting qubit chips (e.g., all matching that particular type/design) can be presented to the antenna chip to get annealed in assembly-line fashion. In some embodiments, a different type/design of superconducting qubit chip can require a different type/design of semiconductor chip (e.g., having multiple antennas positioned on the semiconductor chip in a different configuration, so as to correspond in a one-to-one fashion with the different type/design of qubit chip). Those of skill in the art will appreciate that other embodiments/configurations can be incorporated.

In various embodiments, the positioning of the antenna chip above the first superconducting qubit chip and the positioning the antenna chip above the second superconducting qubit chip can be performed with at least one of a micromanipulator, a piezocontroller, or a temporary attachment, substantially as described. In various other embodiments, the antenna chip can be stationary and the superconducting qubit chips can be presented to the antenna chip for annealing.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 14:
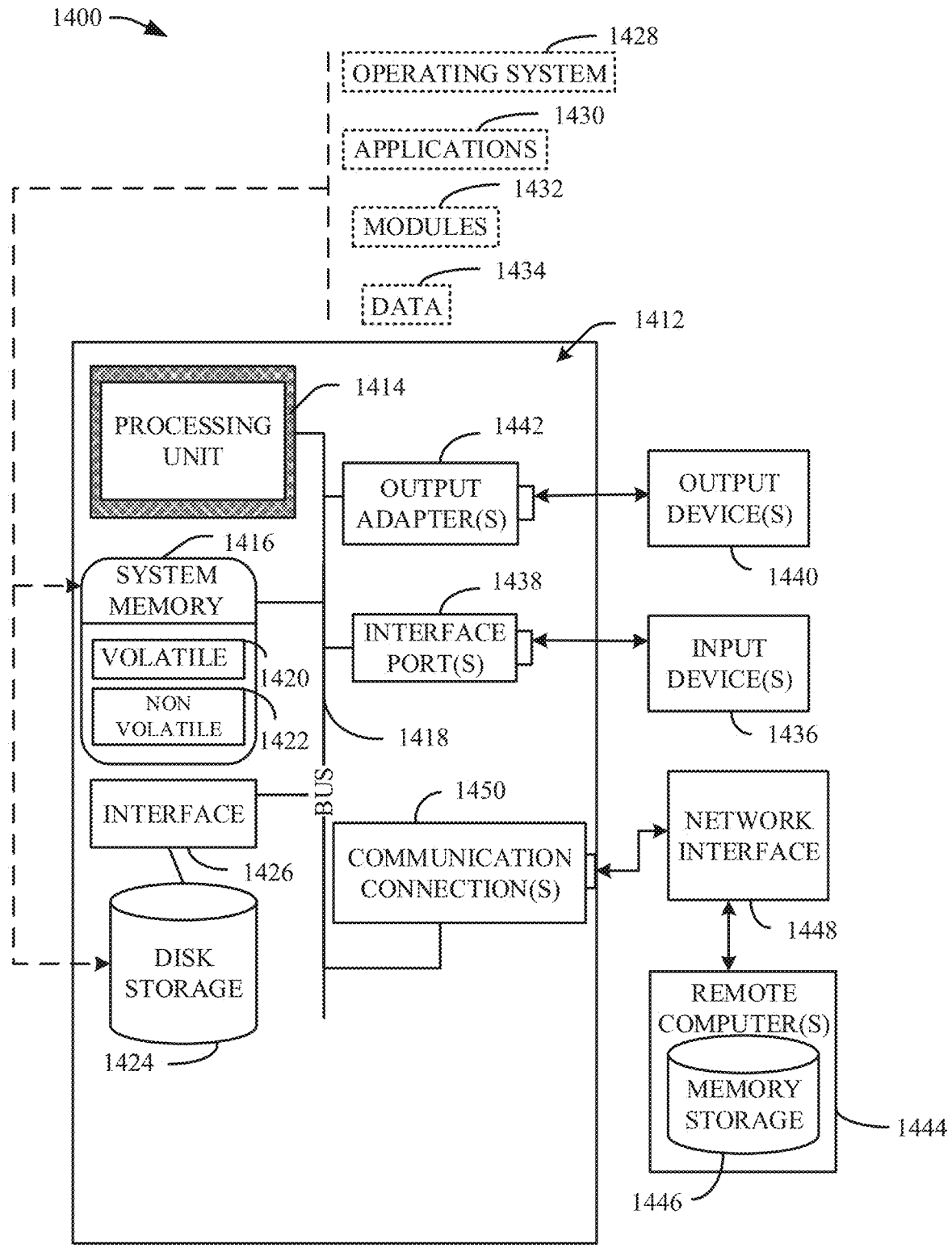
FIG. 14 illustrates a block diagram of an example, non-limiting operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. Repetitive description of like elements employed in other embodiments described herein is omitted for sake of brevity. With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1416 can also include volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1420 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1412 can also include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412. System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

The present invention may be a system, a computer-implemented method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, computer-implemented methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer-implemented method, comprising:
   directing, via a first antenna on an antenna chip located above a superconducting qubit chip having a first qubit and a second qubit, a first electromagnetic wave toward the first qubit;
   annealing, by the first antenna, a first Josephson junction of the first qubit based on the directing, wherein a first length of a first defined vertical gap between the first antenna and the superconducting qubit chip causes the first electromagnetic wave to circumscribe a first set of one or more capacitor pads of the first qubit, thereby heating the first Josephson junction of the first qubit; and
   moving the antenna chip to a second superconducting qubit chip in a manufacturing line via a micromanipulator, a piezocontroller, or a temporary attachment to facilitate annealing of qubits on the second superconducting qubit chip.

2. The computer-implemented method of claim 1, wherein the first length of the first defined vertical gap is a function of a model of a radiation pattern of the first electromagnetic wave as a cone, wherein the cone originates from the first antenna and extends toward the superconducting qubit chip.

3. The computer-implemented method of claim 2, wherein the first length of the first defined vertical gap is approximately equal to a height of the cone.

4. The computer-implemented method of claim 3, wherein a base of the cone circumscribes the first set of one or more capacitor pads.

5. The computer-implemented method of claim 3, wherein an apex angle of the cone is approximately equal to a three-decibel angular beam width of a main lobe of the radiation pattern of the first electromagnetic wave.

6. The computer-implemented method of claim 1, further comprising:
  directing, via a second antenna on the antenna chip, a second electromagnetic wave toward the second qubit; and
  annealing, by the second antenna, a second Josephson junction of the second qubit based on the directing of the second electromagnetic wave, wherein a second length of a second defined vertical gap between the second antenna and the superconducting qubit chip causes the second electromagnetic wave to circumscribe a second set of one or more capacitor pads of the second qubit, thereby heating the second Josephson junction of the second qubit.

7. The computer-implemented method of claim 6, wherein the first antenna directs the first electromagnetic wave for a first time period and the second antenna directs the second electromagnetic wave for a second time period, wherein the first time period and the second time period are overlapping.

8. The computer-implemented method of claim 1, further comprising:
  adjusting a first wavelength of the first electromagnetic wave based on a first physical dimension of the first set of one or more capacitor pads, such that the first wavelength is greater than or approximately equal to four times the first physical dimension of the first set of one or more capacitor pads.

9. A computer-implemented method, comprising:
  positioning, via a micromanipulator, a piezocontroller, or a temporary attachment, an antenna chip above a superconducting qubit chip having a first Josephson junction and a second Josephson junction, with a defined vertical gap between the antenna chip and the superconducting qubit chip;
  emitting, by the antenna chip, an electromagnetic wave toward the first Josephson junction; and
  annealing, by the antenna chip, the first Josephson junction based on the emitting, wherein a length of the defined vertical gap is sized by the micromanipulator, piezocontroller, or temporary attachment to cause the electromagnetic wave to circumscribe the first Josephson junction.

10. The computer-implemented method of claim 9, wherein the length of the defined vertical gap is a function of a model of a radiation pattern of the electromagnetic wave as a cone, wherein the cone originates from the antenna chip and extends toward the superconducting qubit chip.

11. The computer-implemented method of claim 10, wherein the length of the defined vertical gap is approximately equal to a height of the cone, a base of which cone circumscribes the first Josephson junction, and an apex angle of which cone is approximately equal to a three-decibel angular beam width of a main lobe of the radiation pattern of the electromagnetic wave.

12. A computer-implemented method, comprising:
  positioning, by a system, an antenna chip having an antenna above a first superconducting qubit chip having a first Josephson junction;
  annealing, by the antenna, the first Josephson junction by emitting, via the antenna, a first electromagnetic wave toward the first Josephson junction;
  positioning, by the system, the antenna chip above a second superconducting qubit chip having a second Josephson junction; and
  annealing, by the antenna, the second Josephson junction by emitting, via the antenna, a second electromagnetic signal toward the second Josephson junction.

13. The computer-implemented method of claim 12, wherein the positioning the antenna chip above the first superconducting qubit chip and the positioning the antenna chip above the second superconducting qubit chip are performed with at least one of a micromanipulator, a piezocontroller, or a temporary attachment.

\* \* \* \* \*